(12) United States Patent
Borkowski et al.

(10) Patent No.: US 6,430,841 B1
(45) Date of Patent: *Aug. 13, 2002

(54) APPARATUS FOR DRYING BATCHES OF WAFERS

(75) Inventors: Jonathan Borkowski, Sunnyvale; Oliver David Jones, Watsonville; Kenneth C. McMahon, Morgan Hill; Scott Petersen, Scotts Valley; Donald Stephens; Yassin Mehmandoust, both of Santa Cruz; James M. Olivas, Scotts Valley, all of CA (US)

(73) Assignee: Lam Research Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/580,825

(22) Filed: May 26, 2000

Related U.S. Application Data

(60) Provisional application No. 60/136,635, filed on May 27, 1999.

(51) Int. Cl.[7] ................................................. F26B 21/08
(52) U.S. Cl. ............................ 34/557; 34/196; 34/197; 34/228; 34/527; 134/61; 134/104.4; 134/137
(58) Field of Search .......................... 34/527, 535, 557, 34/560, 72, 85, 193, 194, 195, 196, 197, 228, 233; 134/61, 104.4, 137

(56) References Cited

U.S. PATENT DOCUMENTS

| | | |
|---|---|---|
| 4,573,851 A | 3/1986 | Butler |
| 4,611,966 A | 9/1986 | Johnson |
| 4,856,544 A | 8/1989 | McConnell ............... 134/95 |
| 4,955,402 A * | 9/1990 | Miranda ..................... 134/107 |
| 5,331,987 A * | 7/1994 | Hayashi et al. .......... 134/102.1 |
| 5,369,891 A | 12/1994 | Kamikawa ..................... 34/78 |

(List continued on next page.)

FOREIGN PATENT DOCUMENTS

| | | | |
|---|---|---|---|
| EP | 0 328 746 | 8/1989 | |
| EP | 0 855736 A2 | 7/1998 | ........... H01L/21/00 |

(List continued on next page.)

*Primary Examiner*—Ira S. Lazarus
*Assistant Examiner*—Kathryn S. O'Malley
(74) *Attorney, Agent, or Firm*—Martine & Penilla, LLP

(57) ABSTRACT

Liquid is removed from batches of substrates by apparatus and methods for drying substrates that have been wet in an elongated liquid bath. The substrates are moved relative to the bath and an elongated gas-filled volume at rates of movement selected according to the location of the batches of substrates in the bath or the volume. As an example, the substrates and the bath are separated at a controlled rate to form a thin layer of liquid on each substrate as each substrate enters the gas-filled volume. The gas-filled volume is defined by an elongated hot chamber and hot gas directed into the volume and across the substrates and out of the volume continuously transfers thermal energy to the substrates. The flow rate of the gas into the volume is related to introduction of the substrates into the bath to avoid disturbing the liquid in the bath. The thermal energy transferred to the substrates in the volume evaporates the thin layer from the substrates without decreasing the rate of separation of the substrates and the bath below the maximum rate of such separation at which a meniscus will form between the bath and the surface of one of the substrates during such separation. Relative humidity in the volume is controlled by sensing the relative humidity and regulating the speed of a fan that draws gas from the volume.

25 Claims, 18 Drawing Sheets

U.S. PATENT DOCUMENTS

| | | | |
|---|---|---|---|
| 5,520,744 A | | 5/1996 | Fujikawa et al. |
| 5,671,764 A | | 9/1997 | Murakami et al. |
| 5,704,493 A | | 1/1998 | Fujikawa et al. |
| 5,727,578 A | * | 3/1998 | Matthews .................... 134/61 |
| 5,807,439 A | | 9/1998 | Akatsu et al. |
| 5,884,640 A | | 3/1999 | Fishkin et al. |
| 5,902,402 A | * | 5/1999 | Durst et al. ................. 118/423 |
| 5,913,981 A | | 6/1999 | Florez ........................... 134/3 |
| 6,021,791 A | | 2/2000 | Dryer et al. |
| 6,045,624 A | * | 4/2000 | Kamikawa et al. ........... 134/30 |
| 6,095,137 A | * | 8/2000 | Florez ....................... 134/183 |
| 6,108,932 A | * | 8/2000 | Chai ........................... 34/245 |
| 6,158,141 A | * | 12/2000 | Asada et al. .................... 34/74 |
| 6,216,709 B1 | * | 4/2001 | Fung et al. ................ 134/25.4 |

FOREIGN PATENT DOCUMENTS

| | | |
|---|---|---|
| JP | 01022030 | 1/1989 |
| JP | 64-22030 | 1/1989 |
| JP | 06267923 | 9/1994 |
| JP | 6-267923 | 9/1994 |
| JP | 09115871 | 5/1997 |
| JP | 9-115871 | 5/1997 |
| JP | 09-240776 | 9/1997 |
| JP | 09240776 | 9/1997 |
| JP | 10303166 | 11/1998 |
| JP | 10-303166 | 11/1998 |
| JP | 11-40535 | 2/1999 |
| JP | 11040535 | 2/1999 |

* cited by examiner

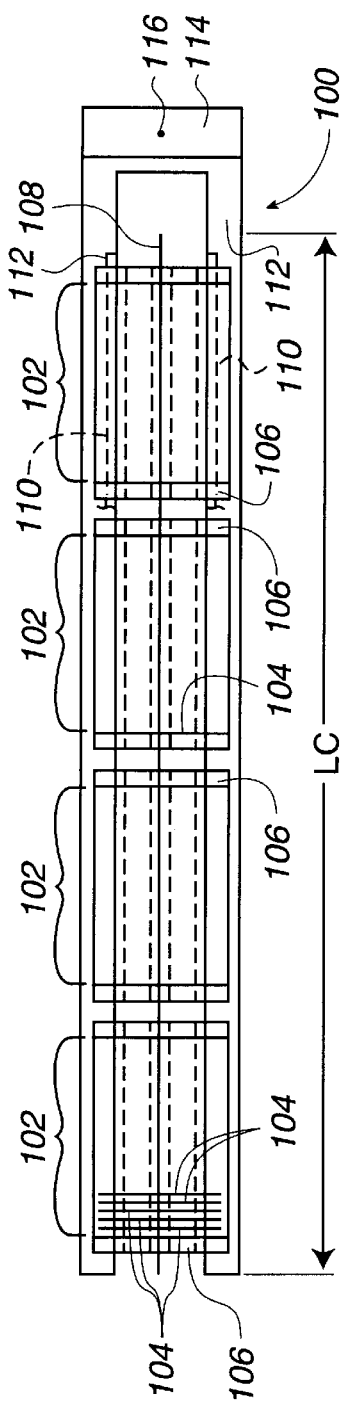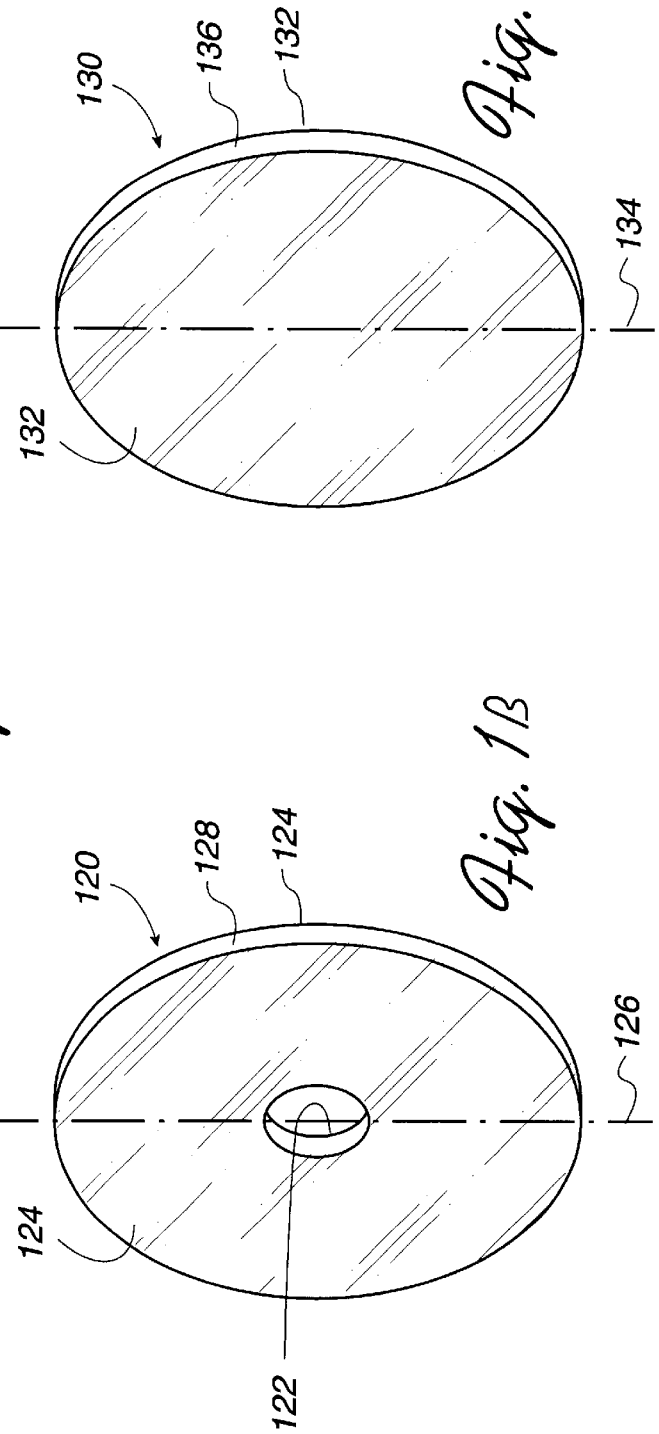

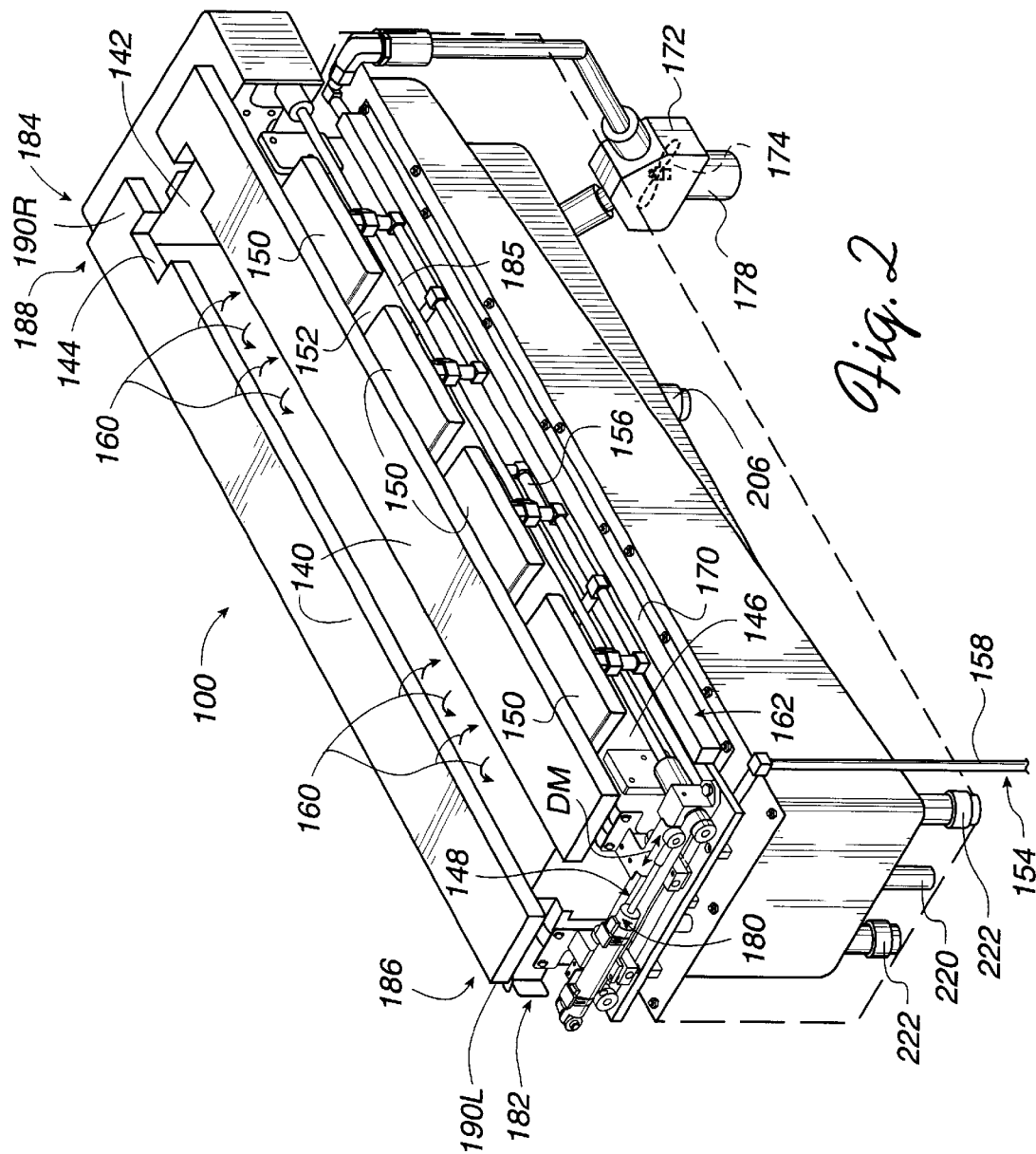

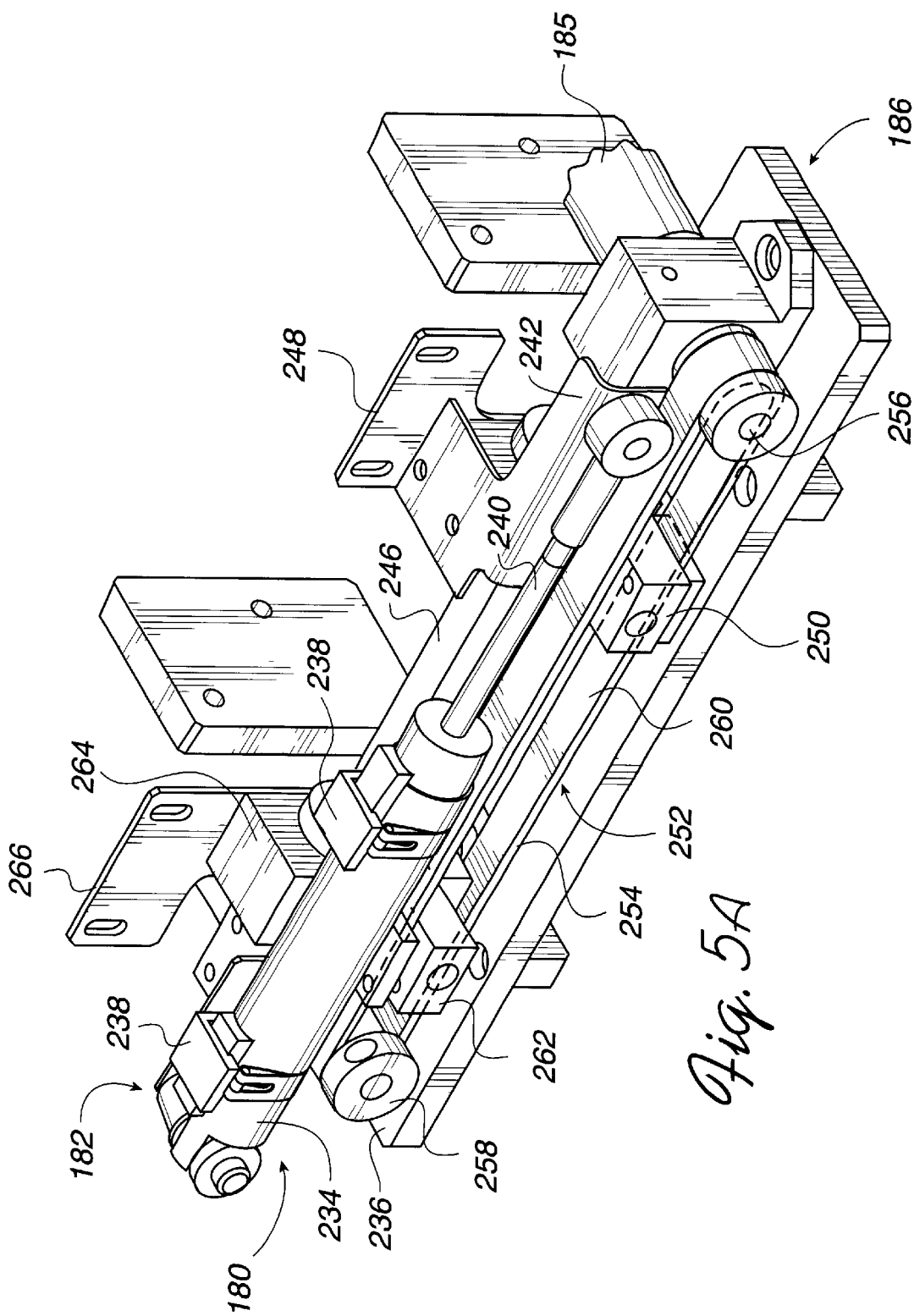

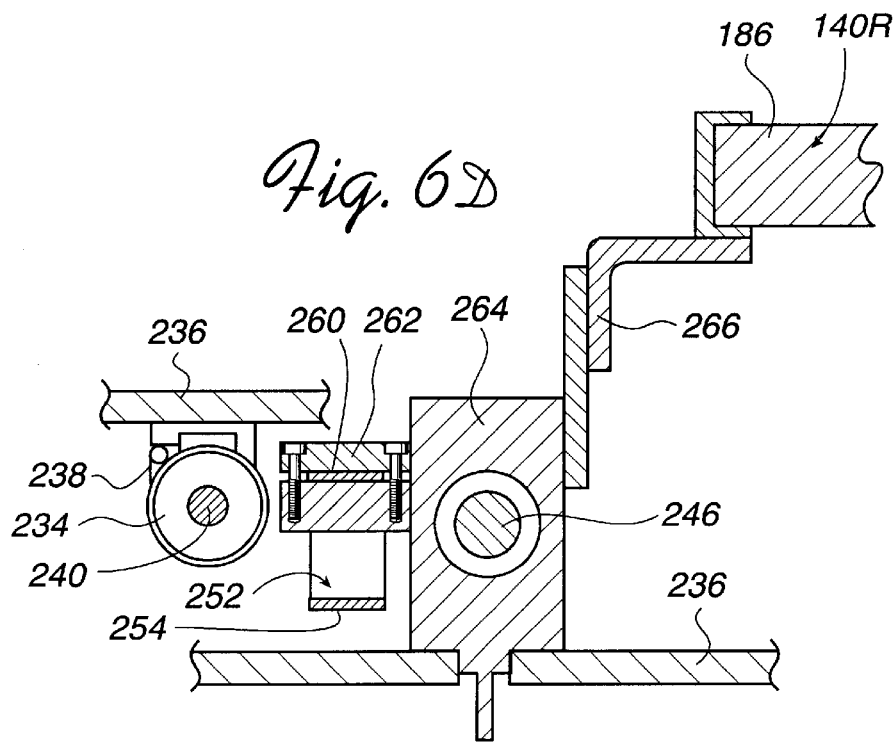
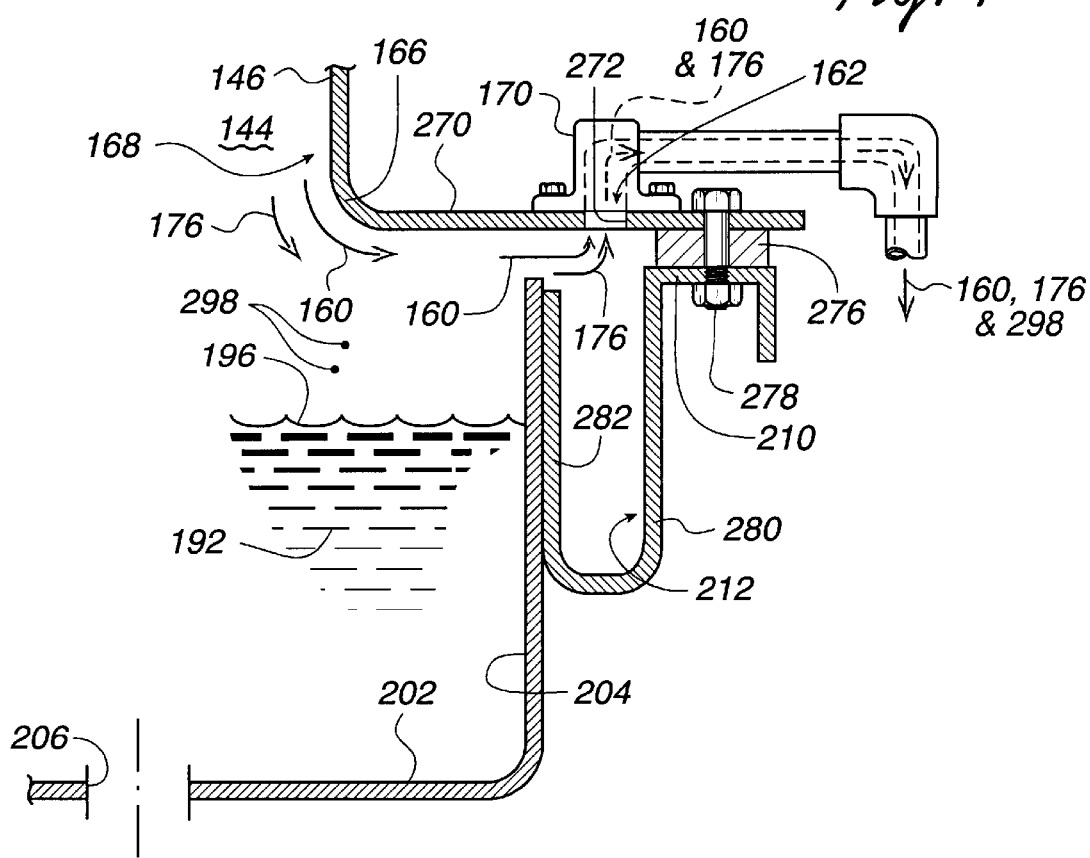

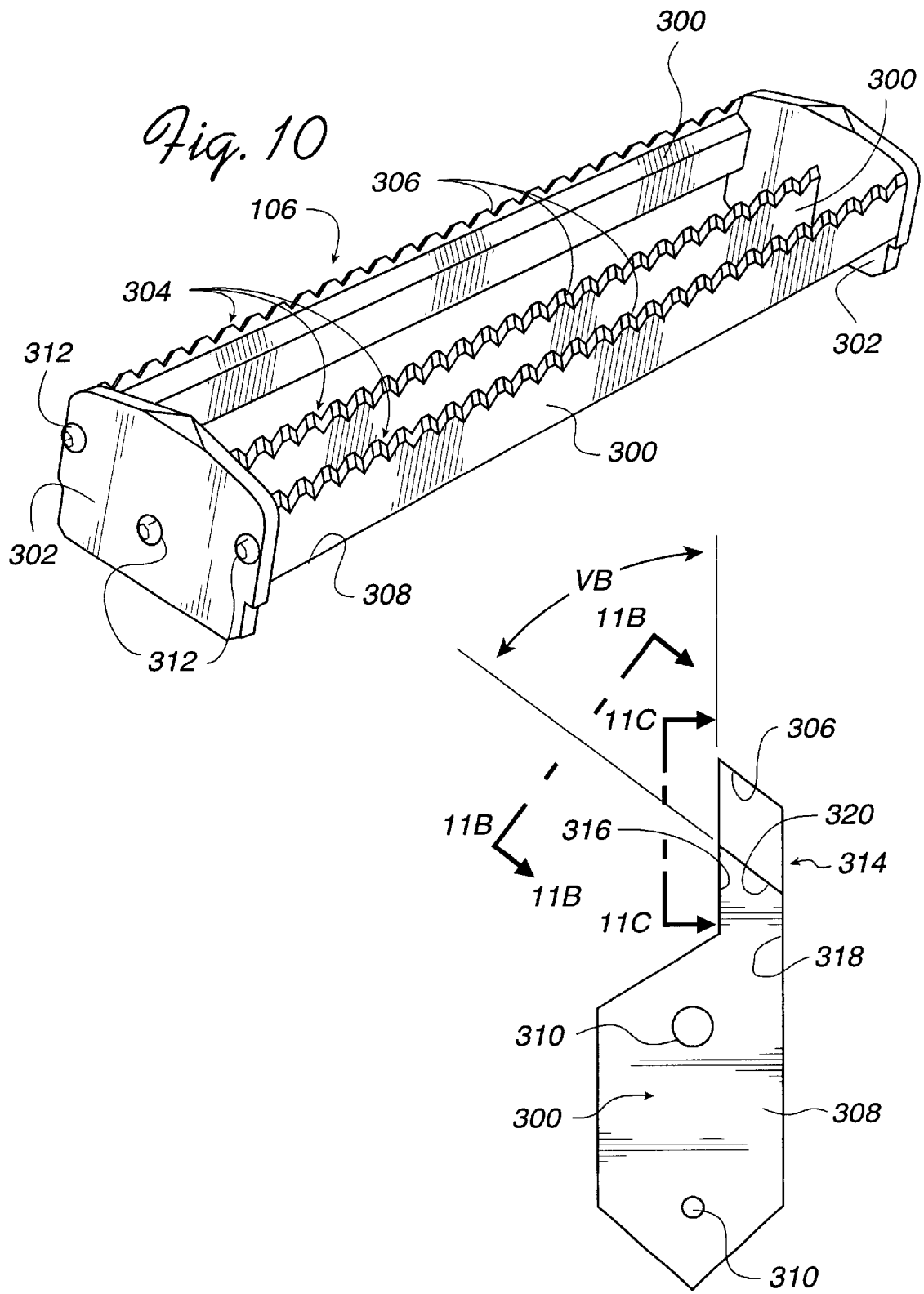

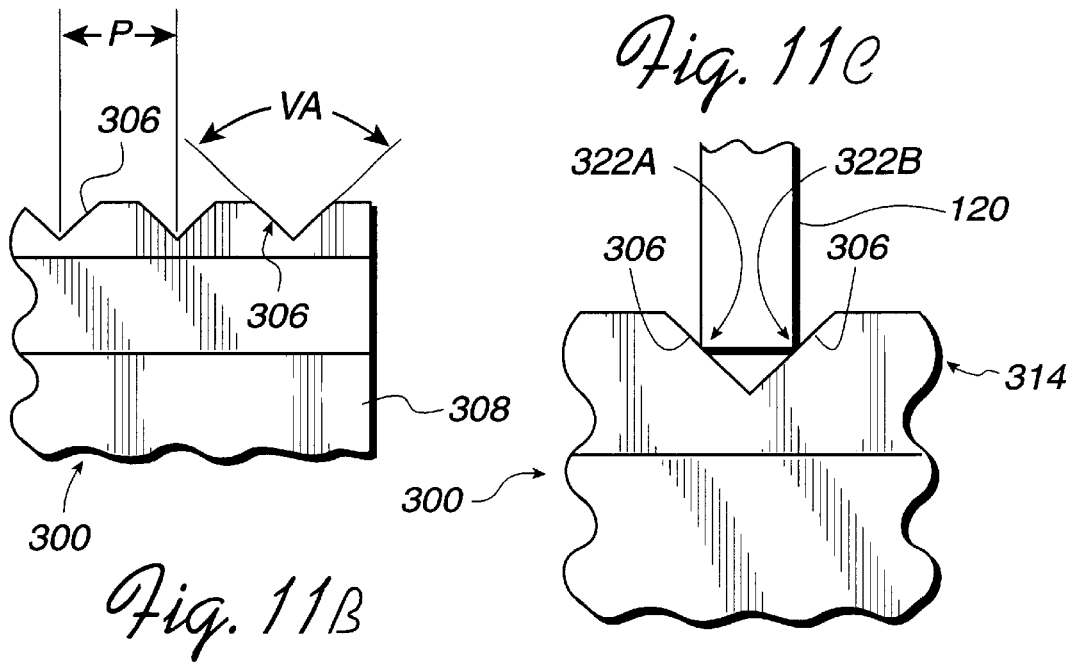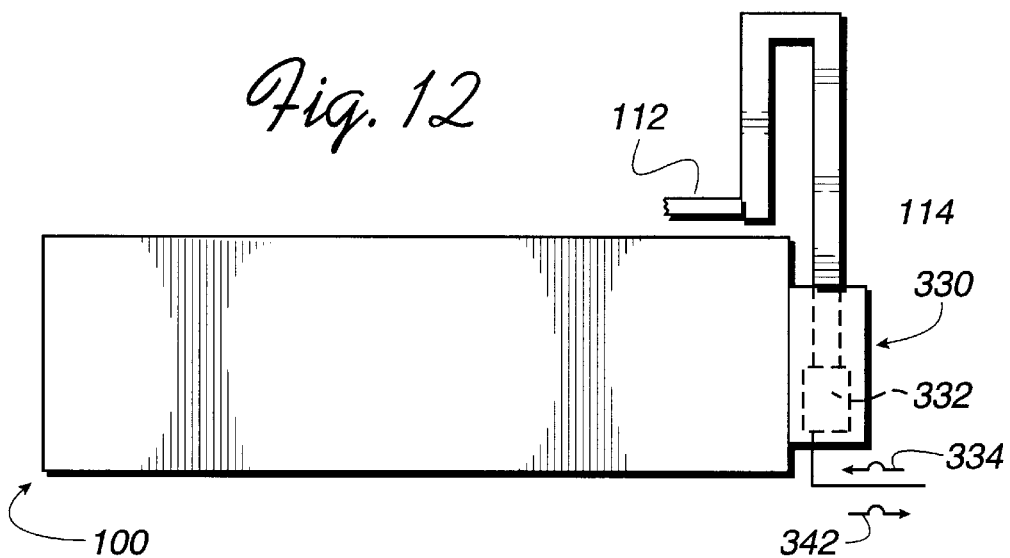

DEEP IMMERSION

SHALLOW IMMERSION

APPARATUS FOR DRYING BATCHES OF WAFERS

CROSS REFERENCE TO RELATED APPLICATION

This application claims priority from U.S. Provisional Patent Application No. 60/136,635 filed May 27, 1999, and entitled "Next Generation Modular Disk Cleaning System Including Transfer, Immersion, Cascade Brush Scrubber and Dryer Assemblies". This Provisional Application is herein incorporated by reference.

BACKGROUND OF THE INVENTION

1. Field of the Invention

The present invention relates generally to removing liquid from substrates, and more particularly to apparatus and methods for drying batches of substrates that have been wet in a liquid bath, after which the batches of substrates and the bath are separated at a controlled rate to form a thin layer of liquid on each substrate of the batches as the batches of substrates are positioned in a gas-filled volume, wherein the volume is defined by an elongated hot chamber that continuously transfers thermal energy to the batches of substrates in the volume, and wherein curtains of hot gas directed into the volume and across the batches of substrates and out of the volume continuously transfer thermal energy to the batches of substrates, so that the thermal energy transferred to the batches of substrates in the volume evaporates the thin layer from each of the substrates without decreasing the rate of separation of the batches of substrates and the bath below a maximum rate of such separation at which a meniscus will form between the bath and the surface of each substrate during such separation.

2. Description of the Related Art

In the manufacture of semiconductor devices, process chambers are interfaced to permit transfer of substrates (such as semiconductor wafers of any of various sizes) between the interfaced chambers. Such transfer is via transport modules that move the substrates, for example, through slots or ports that are provided in the adjacent walls of the interfaced chambers. For example, transport modules are generally used in conjunction with a variety of substrate processing modules, which may include semiconductor etching systems, material deposition systems, flat panel display etching systems, and substrate cleaning systems. Due to growing demands for cleanliness and high processing precision, there has been a greater need to reduce the amount of human interaction during, between, and after such processing steps. This need has been partially met with the implementation of vacuum transport modules which operate as an intermediate substrate handling apparatus (typically maintained at a reduced pressure, e.g., vacuum conditions). By way of example, a vacuum transport module may be physically located between one or more clean room storage facilities where substrates are stored, and multiple substrate processing modules where the substrate are actually processed, e.g., etched or have deposition performed thereon, or cleaned. In this manner, when a substrate is required for processing, a robot arm located within the transport module may be employed to retrieve a selected substrate from storage and place it into one of the multiple processing modules.

Despite use of such intermediate substrate handling apparatus, it is still necessary to clean and dry the substrate at the completion of such processing. As an example, after the substrate have been cleaned, the substrate may have a non-uniform coating of liquid. A substrate with such non-uniform coating of liquid, or with one or more drops of liquid thereon, or with any liquid thereon in any physical form, may be said to be "wet". In contrast, a substrate having a uniform coating of liquid may be said to be "uniformly wet".

In the past, substrates such as annular-shaped disks of many various sizes have been used for manufacturing data storage devices, for example. Such substrates have also been subjected to a drying operation. After cleaning and while wet, such substrates have been placed in a tank containing a bath of hot liquid. In one type of drying operation, the hot liquid has been drained from the tank at a rate such that a thin layer of liquid, rather than one or more drops of liquid, forms on that portion of such substrate that is out of the draining liquid. The thin layer has been preferred over one or more drops because a drop of liquid has a high volume, e.g., from about 0.001 ml. to about 0.020 ml. In comparison to the drop, a thin layer of liquid on a substrate such as a 95 mm diameter disk, may only have a volume of at the maximum diameter of the disk of about 0.0007 ml, for example. Evaporation of a drop generally results in the concentration of small particles at the last small point on the disk at which the drop exists. When the substrate is a wafer, such concentration may result in defects in a chip made from the wafer.

To remove the thin layer from such substrate, reliance has been placed on the thermal energy stored in such substrate to provide the thermal energy necessary to evaporate the thin layer. However, when such substrate is a "wafer", as defined above, problems have been experienced in not properly drying the thin layer from the wafer. For example, it appears that using only such stored thermal energy, the thin layer evaporates from the wafer at a rate less than the maximum rate of separation of the liquid bath and the wafer at which a meniscus will form between the liquid bath and the surface of the wafer during such separation. Thus, the rate at which the liquid is drained from the tank has to be decreased to match the rate of evaporation. Alternatively, the wafer would have to be retained in the tank after the draining has been completed. Each of such decreased rate of draining and such retaining increases the time required to dry the wafer, which increases the cost of fabricating devices based on the wafer.

Additionally, when the substrate is a disk that is used to manufacture generally low-cost data storage devices, for example, it is necessary to process large numbers of such substrates at the same time. However, difficulties have been experienced in assuring uniform drying of each of such substrates. As an example, if the flow rate of the hot gas into the volume is increased in an attempt to process a large number of substrates, the higher flow rate gas may disturb the surface of the liquid bath, resulting in splashing of the liquid onto the surfaces of the substrates. Such splashing may form drops on one or more of the surfaces. Also, even when more than one substrate is processed at the same time, use of a uniform rate of movement of the substrates into, within, and out of the liquid result in inefficiencies, such as relatively long periods of time of a drying cycle. In addition, when more than one substrate is processed at the same time relative humidity problems within the gas volume affect processing of more than one substrate at a time.

In view of the forgoing, what is needed is apparatus and methods of efficiently drying substrates. Such efficient drying should allow batches of the substrates to be efficiently processed. Such efficient drying should also allow the rate of movement of the batches of the substrates to be controlled according to the nature of the movement, e.g., entry of the substrates into the liquid, or movement of the substrates from a deep immersion position to a shallow immersion position in the liquid, or suspense of movement of the substrates, for example. Such control should also allow the liquid and the substrates to be separated at a rate no less than the maximum rate of separation of the liquid and the substrates at which a meniscus will form between the liquid bath and the surface of the substrate. In addition, the efficient drying should assure that the upper surface of the liquid is smooth during such separation. Further, the efficient drying should minimize the effect of relative humidity on the drying of batches of the substrates. Also, the efficient drying should very rapidly remove from the substrate a thin layer of liquid that forms on the substrate as the substrate and the bath are separated, wherein "rapidly" means such removal occurs before the substrate and the bath have been completely separated e.g., separated by 0.004 inches, for example.

SUMMARY OF THE INVENTION

Broadly speaking, the present invention fills these needs by providing apparatus and methods of efficiently removing fluid from batches of substrates. The efficient removing is attained by providing apparatus and methods for drying batches of substrates that have been uniformly wet in a fluid bath. Such efficient drying is enhanced by controlling the rate of movement of the batches of the substrates according to the nature of the movement, e.g., entry of the substrates into the liquid, or movement of the substrates from the deep immersion position to a shallow immersion position in the liquid, or suspense of movement of the substrates, for example. As another example, the batches of substrates and the bath are separated at a controlled rate to form a thin layer of fluid on each of the substrates in the batches as each of the substrates is positioned in an elongated gas-filled volume. In addition to such separation, the efficient removing is attained by defining the gas-filled volume by use of an elongated hot chamber and curved gas inlet manifolds that form an elongated curtain of hot gas that transfers thermal energy to the batch of substrates in the volume. Further, during a drying cycle, the elongated curtain of hot gas is continuously directed into the volume and across each substrate of the batch of substrates and out of the volume to continuously transfer thermal energy to the wafer. While the directing of the gas out of the volume is independent of the separation of the bath and the substrates, the rate of gas flow into the volume is decreased during entry of the batches of the substrates into the volume. In addition, conditions are controlled so that the upper surface of the fluid is smooth during such separation. The thermal energy transferred to the batches of substrates in the bath and in the volume very rapidly evaporates the thin layer from the wafer without decreasing the rate of separation of the batches of substrates and the bath below the maximum rate of such separation at which a meniscus will form between the bath and the surface of the substrates during such separation. The effect of relative humidity in promoting recondensation of liquid vapor onto the dried substrates of the batches is avoided by providing an exhaust fan to draw the liquid vapor-laden gas from the volume at a location away from the elongated hot chamber.

Such efficient removal enables the substrate throughput of such apparatus and method to be limited only by the type of substrate that is being dried, and the type of liquid used to wet the substrate. For example, the characteristics of particular types of substrates and liquid dictate the maximum rate of such separation of the substrate and the bath at which a meniscus will form between the bath and the surface of the substrate during such separation, and at which the substrate will be uniformly wet.

In one embodiment of the present invention, a system for drying batches of substrates is provided with an elongated bath enclosure configured to hold fluid. The fluid defines a top fluid surface and the elongated bath enclosure has an upper end defined by a weir having a saw-toothed configuration. A temperature and humidity-controlled chamber is defined above the upper end, the chamber being elongated corresponding to the elongation of the elongated bath and having opposing long walls. The chamber has a series of first openings along the long walls at a first location adjacent to the upper end and opposed second openings at a second location that is spaced from the upper end.

In one aspect of the one embodiment of the present invention, a system for drying batches of substrates is provided for substrates having opposite planar sides that are parallel to a planar axis. A substrate transport unit immerses a plurality of batches of substrates in the fluid with the planar axis of each substrate generally perpendicular to the fluid surface and the opposite planar sides of each substrate generally perpendicular to the long walls. A drive is provided for causing the substrate transport unit to move the batches of substrates within and out of the fluid with the planar axis remaining generally perpendicular to the fluid surface. The drive controls the rate of movement of the batches of substrates according to the location of the batches of substrates within and out of the fluid.

In another aspect of the one embodiment of the present invention, a controller is provided to control operation of the drive to simultaneously move the batches of substrates at rates of movement controlled according to the location of the batches of substrates within and out of the fluid.

In a next embodiment of the present invention, apparatus is provided for drying a plurality of batches of substrates, wherein each of the substrates has opposite sides. A bath is adapted to contain hot liquid, and the liquid defines an upper liquid surface. The bath is elongated to simultaneously receive the plurality of batches of substrates aligned in series along a batch substrate path. The bath has a saw toothed weir defining an upper end of the bath over which the liquid may flow out of the bath. A liquid collection tank surrounds and supports the bath for receiving the liquid flowing over the weir, and the tank has an upper end above the weir. A drain system is connected to the tank for recirculating the liquid that flowed over the weir. The drain system heats, filters, and returns the liquid to the bath. An enclosure is configured to receive the plurality of batches of substrates aligned in series along the batch substrate path. The enclosure has opposing elongated walls positioned on opposite sides of the batch substrate path. Also, the enclosure has an upper end and a base spaced from the upper end, the walls being connected to the tank for supporting the tank and the bath. A series of gas inlets is defined in each of the opposing elongated walls at the upper end of the enclosure and spaced from the weir. The inlets extend along the opposing elongated walls on opposite sides of an upper position of the batch substrate path. A gas outlet adjacent to the base of each of the elongated walls is spaced from the upper liquid surface. The enclosure and the inlets and the outlets define continuous gas flow paths from the inlets through the enclosure to the outlets, the flow path extending across the weir for drawing ambient vapor from the bath directly to the outlets.

In another aspect of the next embodiment of the present invention, the substrates each have a narrow edge between the sides and the carrier has elongated spaced arms configured to extend in the enclosure parallel to and between the opposing elongated walls. A substrate batch nest corresponds to each batch of the substrates. Each nest includes a plurality of spaced bars and spaced end plates mounting the bars on the spaced arms. Each of the bars includes a vertical surface intersecting a three-dimensional V-shaped notch that corresponds to each substrate to be carried. Each V-shaped notch is formed in the bar with a valley and opposite walls extending at an acute angle with respect to the vertical surface. The vertical surface and the acute angle of the V-shaped notch combine to limit the contact between the substrate and each V-shaped notch. The contact is a substantially point contact between one of the opposite walls of the notch and one end of the narrow edge of the substrate.

In a further embodiment of the present invention, apparatus is provided for drying a plurality of batches of substrates. There is a relatively short wall at each end of the opposing elongated walls. The upper end of the enclosure is provided with an elongated opening defined by the opposing elongated walls and by the relatively short walls. The elongated opening is configured to receive the plurality of batches of substrates aligned in the series along the batch substrate path. A plurality of doors is provided, each door having first ends adjacent to one of the short walls and opposite second ends adjacent to the other of the short ends. Door mounts are adjacent to each of the short walls for guiding the doors across the elongated opening in opposition to each other. A drive is mounted adjacent to one of the short walls and connected to the first end of one of the doors. A first endless belt is driven by the drive and is connected to the corresponding first end of the other of the doors so that the corresponding first ends of the doors move simultaneously on the door mounts. A connecting shaft is provided for each of the doors. The shafts are driven by the first endless belt and extend from the one of the short walls to the other of the short walls. A second endless belt driven by the connecting shafts moves the opposite corresponding second ends of the doors simultaneously and in synchronism with the movement of the corresponding first ends of the doors to open or close the elongated opening.

In a method embodiment of the present invention, drying a substrate includes an operation of simultaneously immersing a plurality of batches of substrates into a bath of hot liquid having a given depth extending from a liquid surface to a bottom of the bath. The immersing operation positions the batches of substrates at a deep immersion location adjacent to the bottom. The substrates are retained at the deep immersion location for a predetermined period of time. After the predetermined period of time, there is an operation of quickly transiting the batches of substrates from the deep immersion location to a shallow immersion location adjacent to the liquid surface. A further operation pulls the batches of substrates out of the liquid from the shallow immersion location to dry the batches of substrates.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

FIG. 1A depicts an apparatus for moving batches of substrates held in separate carriers (or nests) for drying the batches of substrates according to the present invention.

FIGS. 1B and 1C respectively depict a substrate in the form of an annular-shaped disk for memory applications, and a substrate in the form of a wafer for semiconductor device manufacture.

FIG. 2 depicts a perspective view of an apparatus for drying the batches of substrates according to the present invention, wherein an elongated set of doors allow access to an elongated gas-filled chamber provided above a bath for heated liquid.

FIGS. 5A and 5B depict a perspective views of a first end of the apparatus for drying the batches of substrates according to the present invention, wherein a drive having one motor shown in FIG. 5A moves a corresponding first end of the elongated set of doors on a guide rod shown in FIG. 5B in synchronism to open or close the chamber.

FIG. 6D is a cross sectional view of the shaft for guiding the movement of the first end of the doors, showing a second of the doors connected to an opposite length of the belt.

FIG. 7 is an enlarged cross sectional view of the connection between the chamber and the tank, showing the tank supported by the chamber and supporting the bath.

FIG. 10 is a perspective view of one of the carriers shown in FIG. 1, depicting spaced bars configured to contact each substrate of the batches of substrates, wherein such contact is limited.

FIG. 11A is a cross sectional view of one of the bars of the carrier, showing a thin upper section having spaced vertical surfaces that are cut by V-shaped notches that define a nest for a substrate.

FIG. 11B is a cross sectional view taken along line 11B—11B in FIG. 11A, showing the V-shaped notches.

FIG. 11C is an enlarged view taken along line 11C—11C in FIG. 11A, showing a substrate nested in one V-shaped notch, illustrating one substantially point of contact between a thin end of the substrate and one of two opposite walls of the V-shaped notch.

FIG. 12 is a schematic view of the side of the apparatus for drying the batches of substrates, illustrating a drive for moving an arm that carries the carriers, wherein the positions of the carriers are controlled by a controller.

DETAILED DESCRIPTION OF THE PREFERRED EMBODIMENTS

Figure 3:
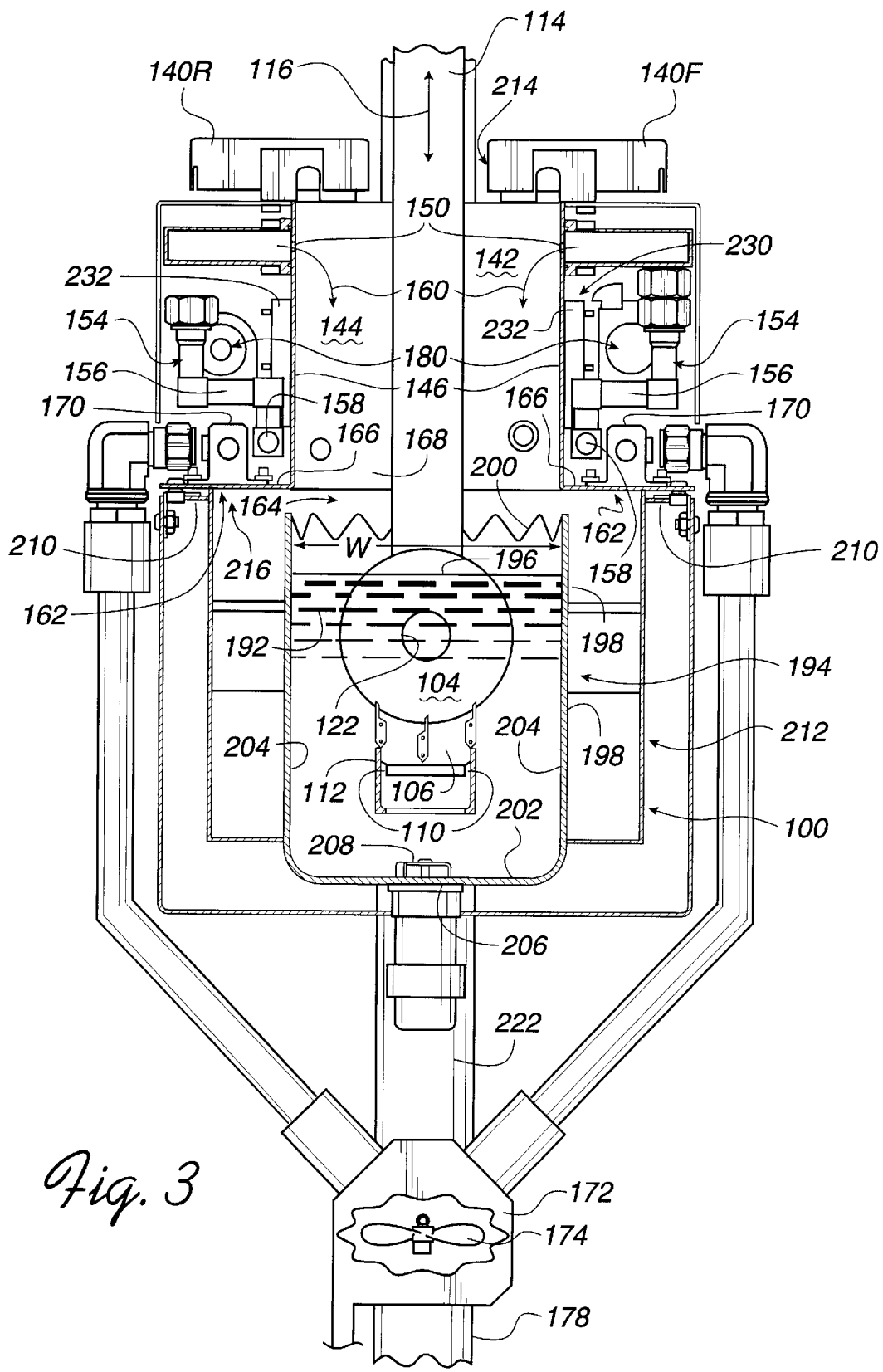
FIG. 3 is an end elevational view of the apparatus shown in FIG. 2, illustrating gas inlets on opposite sides of the elongated gas-filled chamber and gas outlets provided above the bath.

An invention is described for drying batches of substrates. The invention is described in terms of apparatus for and methods of efficiently removing liquid from the substrates. More particularly, the invention is described in respect to apparatus and methods for removing liquid from batches of substrates to dry the substrates after the batches of substrates have been wet in a liquid bath. The removing of the liquid is initiated as the substrates and the bath are separated at a controlled rate to uniformly wet the substrates, i.e. to form thin layers of liquid on portions of a substrate just as the portions leave the bath and enter a hot-gas-filled volume defined by a hot chamber. The hot chamber and the hot gas continuously transfer thermal energy to the substrates and the thin layers in the volume. The removing of the liquid is rapidly completed as the substrates enter the volume in that the thermal energy transferred to the substrates and to the thin layer very rapidly evaporates the thin layers from the substrates. The evaporation is at a high enough rate such that there is no decrease in the rate of separation of the substrates and the bath below the maximum rate of such separation at which a meniscus will form between the bath and the surface of the substrates during such separation. Additionally, the relative humidity in the hot-gas-filled volume is controlled to inhibit recondensation of vapor from the bath. It will be obvious, however, to one skilled in the art, that the present invention may be practiced without some or all of these specific details. In other instances, well known process operations have not been described in detail in order not to obscure the present invention.

FIG. 1A depicts an apparatus 100 for moving batches 102 of substrates 104 held in separate carriers 106 for drying the batches 102 of substrates 104 according to the present invention. According to the size, for example, of the substrates 104, there may be many substrates 104 in a batch 102. The batches 102 of substrates 104 depicted in the Figures may include twenty-five substrates 104 per batch 102, for example. However, other numbers of substrates 102 may be provided in a batch 102. Each batch 102 is carried by one of the separate carriers 106, which are also referred to as nests.

FIG. 1A shows an exemplary four nests 106, and thus four batches 102 of substrates 104, aligned on a horizontal substrate drying axis 108. A pair of spaced elongated nest fingers 110 (partially shown in dashed lines) is mounted on a bifurcated horizontal arm 112 cantilevered from a main batch drive column 114. The fingers 110 support the nests 106. The arm 112 and the fingers 110 have a length LC sufficient to carry four exemplary nests 106, although other numbers of nests 106 and lengths LC may be provided according to the desired substrate throughput. The main drive column 114 is mounted for vertical movement along a vertical axis 116, and moves the spaced arms 112 up and down to move the batches 102 of substrates 104 during substrate drying operations.

FIG. 1B shows that the substrates 104 may be annular-shaped disks 120 having a central aperture 122. The disks 120 may be of any of various sizes, e.g., 65 or 95 mm. in diameter, and may be fabricated from glass or aluminum, e.g., for applications such as for manufacturing data storage devices (not shown), for example. Such disks 120 have opposite planar sides 124 parallel to a disk axis 126. The sides 124 are separated by a thin edge 128. Because there is generally no edge exclusion on a disk 120 (typically five mm.), the entire annular area of such disk 120 is generally used, such that care must be taken to properly dry such entire area. Such care includes minimizing the surface area of the disk 120 that is touched in supporting the disk during the drying operation. By using adequate care according to the present invention, one may avoid having so-called "mouse-ears" (not shown) form at the junction of the edge 128 and the side 124 of the disk 120. Mouse-ears are formed, for example, when de-ionized water dries at a spot on the side 124 near the edge 128 of the disk 120. Such annular-shaped disks 120 for data storage devices and similar applications are referred to below as "disks", and are included within the term "substrates".

FIG. 1C shows that the substrates 104 may also be circular-shaped and have any of various sizes, such as 200 mm. or 300 mm. in diameter. Such substrates 104 are known as "wafers" 130, may be made from semiconductor material, and are used for manufacturing semiconductor chips (not shown), for example. Such wafers 130 have opposite planar sides 132 parallel to a wafer axis 134. The sides 132 are separated by a thin edge 136. Although there generally is an edge exclusion on a wafer 130 (and thus not all of the entire circular area of such wafers 130 is used), care must still be taken to properly dry the entire circular area. For example, because mouse-ears may be relatively large and extend beyond the edge exclusion, one must still exert adequate care, such as by minimizing the surface area of the wafer 130 that is touched to support the wafer 130 during the drying operations. Such circular-shaped wafers 130 for semiconductor device manufacture and similar applications are referred to below as "wafers", and are included within the term "substrates" as used below.

FIG. 2 depicts the apparatus 100 for drying batches 102 of the substrates 104 according to the present invention. The elongated arms 112 lower the plurality of carriers 106, with the batches 102 of substrates 104 thereon, between open elongated opposing doors 140 that are movably mounted at the top 142 of a chamber 144. Below the doors 140 an elongated temperature and humidity-controlled chamber 144 is defined and receives the batches 102 of substrates 104. The elongation of the chamber 144 corresponds to the length LC of the arms 112. The chamber 144 is defined by opposed vertical long walls 146 spaced by length L, and opposed short vertical walls 148.

The chamber 144 has a series of first openings (or gas inlets) 150 along the long walls 146 at a first, or upper, location 152 adjacent to the top of the chamber 144. A gas supply system 154 includes a plurality of pipes 156 extending from a gas main 158 to the gas inlets 150 to supply heated gas 160 to the chamber 144.

Referring also to FIG. 3, a series of opposed second openings, or gas outlets 162, is provided at a second, or lower, location 164. The outlets 162 extend through an exterior base 166 of each of the long walls 146. The base 166 coincides with a bottom 168 of the chamber 144. On each side of the base 166, the gas outlets 162 are covered by an elongated exhaust manifold 170 mounted on the base. Each of the manifolds 170 is connected to a plenum 172 that houses a variable speed fan 174 that exhausts the gas 160 and air-borne fluid vapor (see arrows 176 in FIG. 7), into an outlet pipe 178 that is connected to the main exhaust (not shown) of the plant in which the apparatus 100 is housed. A door control drive 180 has a separate left section 182 and a right section 184 at each respective left end 186 and right end 188 of the apparatus 100. The separate sections 182 and 184 are connected by a shaft 185 to simultaneously apply door motion forces DM to an opposite left end 190L and a right end 190R of the doors 140 to open and close the doors 140, and thus effectively open and close the chamber 144. Except as described below, the separate sections 182 and 184 are the same.

FIG. 3 shows the nest support fingers 110 positioned by the arm 112 below the chamber 144 and in liquid, or fluid 192, contained in an elongated bath, or bath enclosure 194, configured to receive the batches 102 of substrates 104. The fluid 192 may be water. Preferably, the water 192 is de-ionized. More preferably, the water 192 both de-ionized and filtered. Most preferably, the water 192 is both de-ionized and filtered, and heated, before flowing into the bath 194. The fluid 192 defines a top fluid surface 196 which may vary in height as described below. The elongated bath enclosure 194 has an upper end 198 defined by a weir 200 having a saw-toothed configuration. The temperature and humidity-controlled chamber 144 extends above the upper end 198 of the bath 194 and is spaced from the saw toothed weir 200. FIG. 3 also shows that the bath 194 has a generally U-shaped cross section defined by a bottom 202 and elongated walls 204. The weir 200 having the saw-toothed configuration is at the top of the walls 204 of the bath 194. Two main fluid inlets 206 extend through the bottom 202 to supply the fluid 192 to the bath 194. The inlets 206 are provided with diffuser plates 208 to spread the incoming fluid 192 laterally across the width W (and length L, FIG. 4) of the bath 194.

FIG. 3 also shows the gas supply pipes 156 connected to the gas inlets 150, and the gas exhaust manifolds 170 over the gas outlets 162. The base 166 of the chamber walls 146 and 148 is connected to a flange 210 of a fluid outlet tank 212. The tank 212 surrounds and supports the bath 194. FIG. 3 also shows that each of the doors 140 is provided with a notch 214 so that when the main column 114 has lowered the batches 102 of substrates 104 into the bath 194, the main column 114 will clear the doors 140 to permit movement of the main column 114, and the closed doors 140 may abut and close the chamber 144. The clearance is designed to minimize leakage of the gas 160 from the chamber 144 without interfering with vertical travel of the main column 114.

Figure 4:
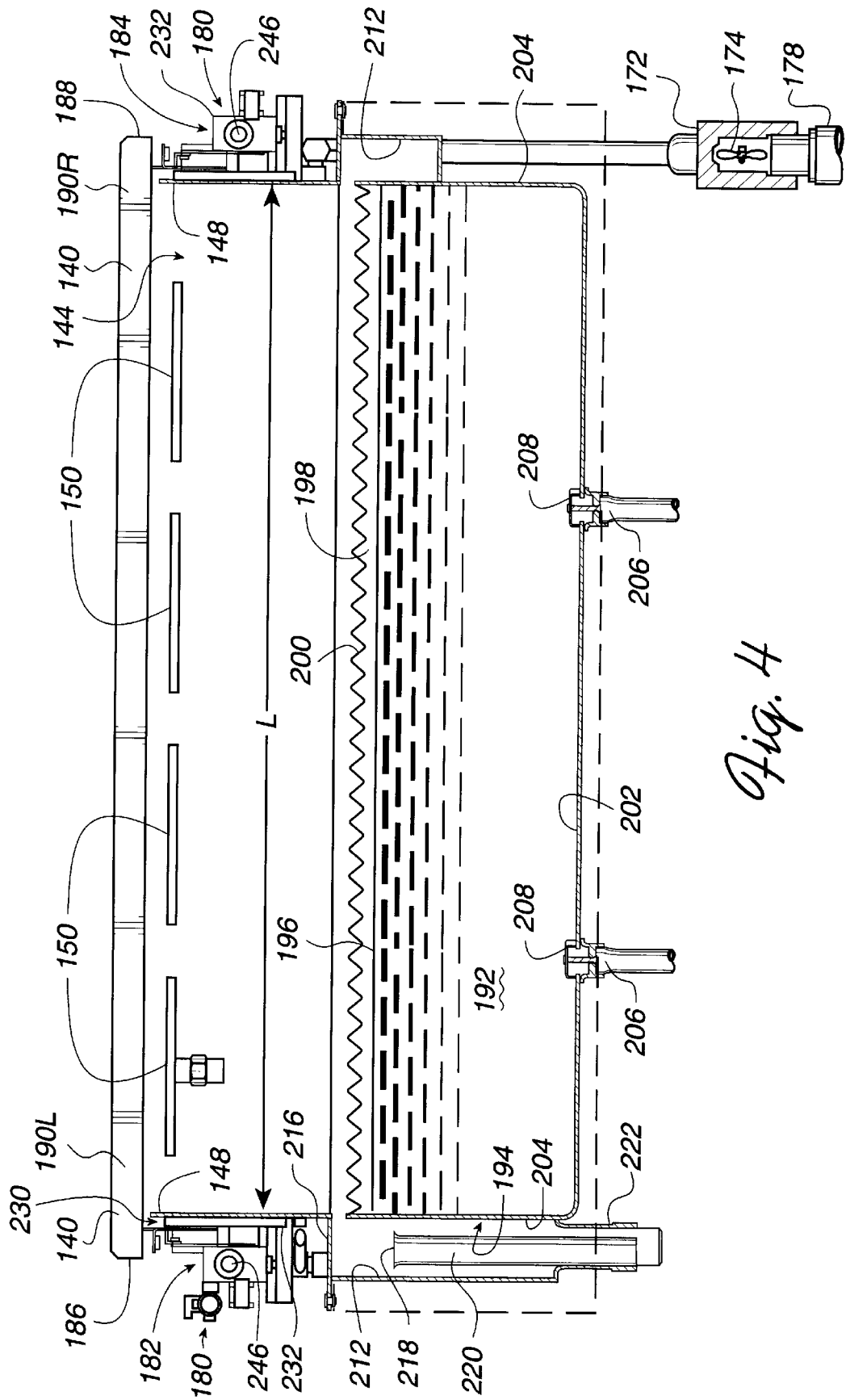
FIG. 4 is a side elevational view of the apparatus shown in FIGS. 2 and 3, illustrating the bath having a saw toothed weir and a drain tank surrounding the bath for receiving liquid from the bath.

FIG. 4 shows the elongated chamber 144 and the bath 194, which have corresponding lengths L sufficient to receive the length LC of the arm 112. The tank 212 is shown outside the bath 194 supporting the bath 194. An upper end 216 of the tank 212 is shown above a top level, or open end 218, of a standpipe 220 that drains any abnormal overflow of liquid 192 from the bath 194. With the liquid 192 continuously supplied to the bath 194, the liquid 192 may overflow the weir 200, especially as the bath 194 receives the nests 106 and the substrates 104. The normal overflow is drained from the tank 212 by a pair of recirculating drains 222 provided at the left end 224 (FIG. 4) of the tank 212. With proper operation of the recirculating drains 222, no flow will be received by the standpipe 220. FIG. 4 also shows the gas inlets 150 as being elongated and spaced by short distances to provide and spread the incoming gas 160 across the length L of the chamber 144.

FIGS. 3 and 4 show a system 230 for heating the long walls 146 and the short walls 148 that define the chamber 144. The system 230 includes flat electrical resistance heaters 232 secured to the sides of the walls 146 and 148 opposite to the chamber 144. The heaters 232 are controlled to maintain the temperature of the walls 146 and 148 of the chamber 144 at a desired temperature so that thermal energy may be transferred to the gas 160 to assist in maintaining the gas 160 at a desired temperature.

Figure 5B:
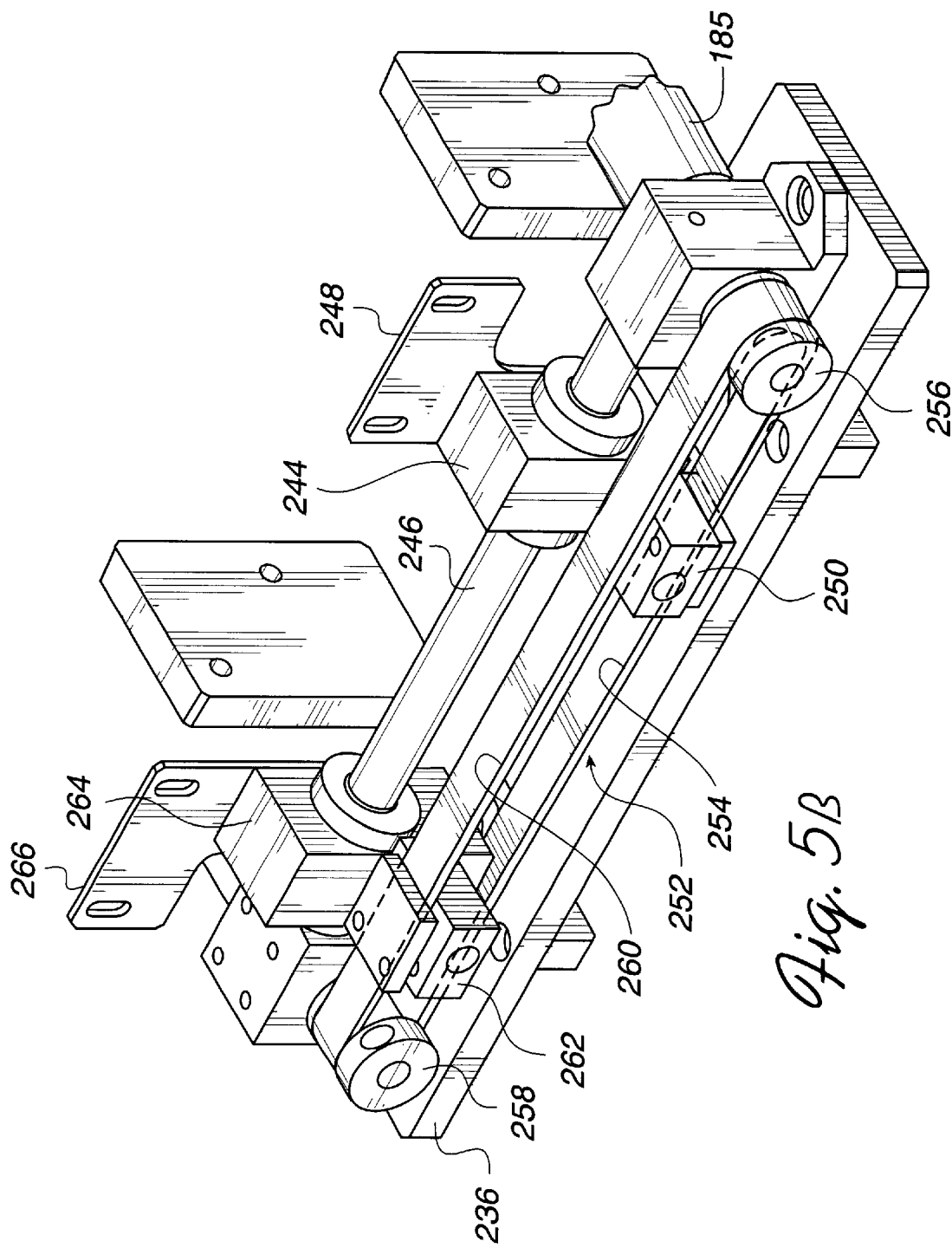
Figure 6A:
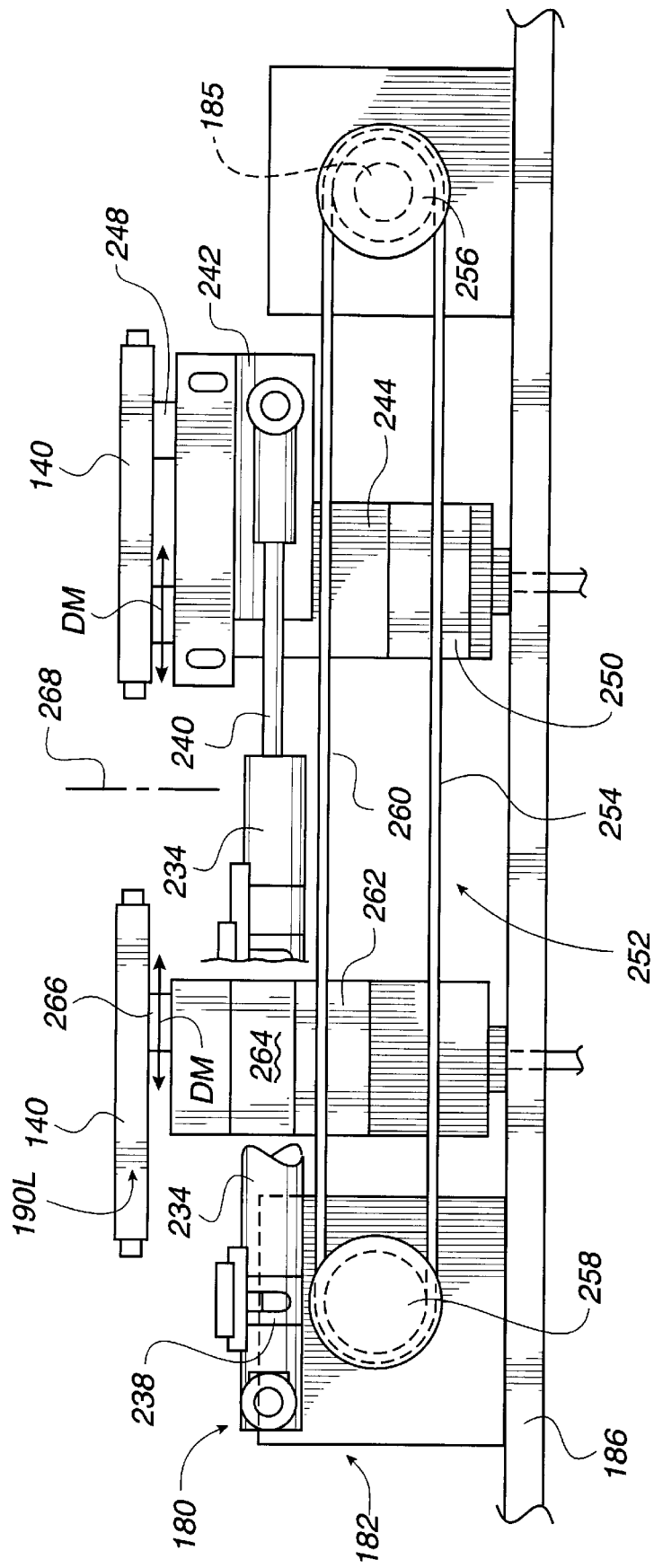
FIG. 6A is an end view of the first end of the drive, showing a single pneumatic motor that directly moves one of the doors, and a belt driven by the motor for moving the other of the doors.
Figure 6B:
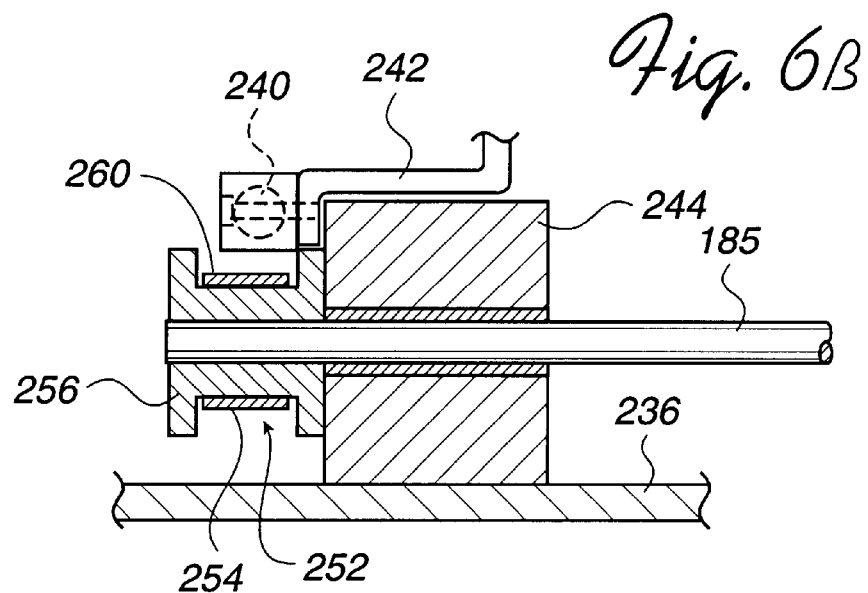
FIG. 6B is a cross sectional view of one pulley for the endless belt, showing one of two shafts for moving a corresponding second opposite end of the elongated set of doors in synchronism with movement of the first end.
Figure 6C:
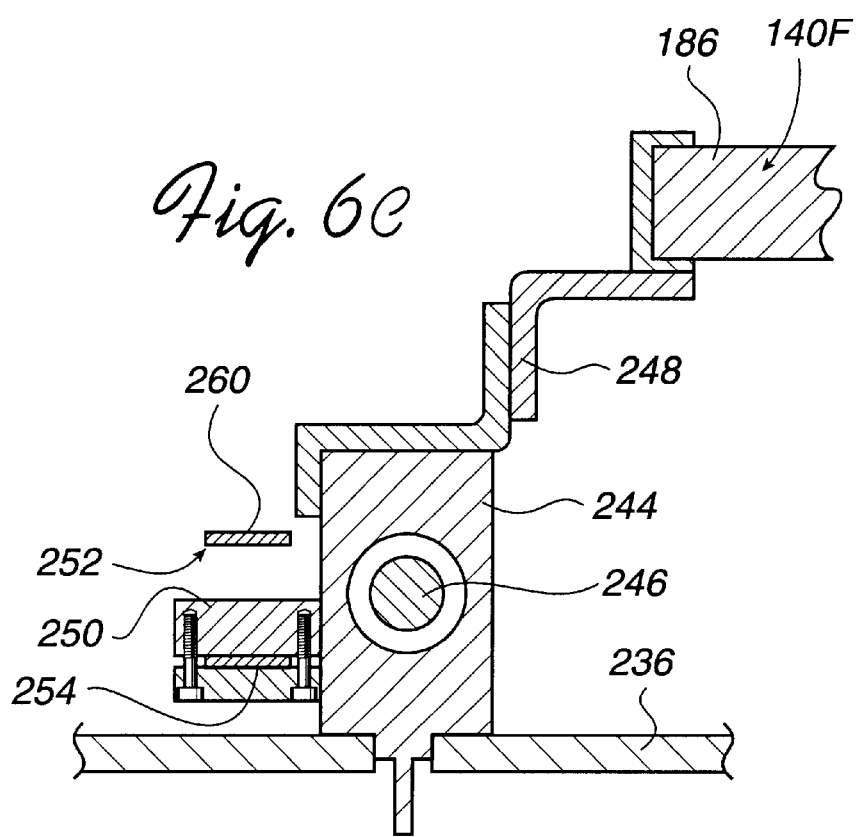
FIG. 6C is a cross sectional view of a shaft for guiding the movement of the first end of the doors, showing one of the doors connected to one length of the belt.

FIGS. 5A, 5B, and 6A through 6D show the one section 182 of the door control drive 180 at the left end 186 of the apparatus 100 as viewed in FIG. 2. The separate section 182 has a main pneumatic motor 234 that drives both sections 182 and 184. The main motor 234 is mounted at a fixed location relative to a frame 236 of the apparatus 100 by brackets 238. A piston rod 240 is driven by the main motor 234 to move a bent front plate 242 attached to the front door 140F. The plate 242 is also secured to a front force transfer block 244 that rides on one of two door guides, or guide rods, 246 that extend from the front to the back of the apparatus 100 as seen in FIG. 2. As the piston rod 240 moves toward the front, the front block 244 is moved toward the front on the guide 246 and correspondingly moves both a front door bracket 248 and a lower belt clamp 250 toward the front. The lower clamp 250 is secured to an endless belt 252, and particularly to a lower length, or run 254, of the belt 252. The endless belt 252 extends around two spaced pulleys 256 and 258, pulley 256 being at the front and pulley 258 being at the rear as seen in FIGS. 2, 5A and 5B. As noted above, sections 182 and 184 are the same, and the exception is that the shaft 185 and not the motor 234 (there is no motor 234 for the section 184), rotates the corresponding front pulley 256 of right section 184. At right section 184, that front pulley 256 drives the corresponding belt 252 (not shown), and the structure and operation are otherwise the same.

Since the lower clamp 250 is driven by the motor 234 through the front block 244, the forward motion of the piston rod 240 causes the lower length 254 of the belt 252 to travel forwardly and an upper run 260 of the belt 252 to move toward the rear. A second, upper belt clamp 262 is secured to, and driven by, the upper run 260 of the belt 252. The upper run 260 of the belt 252 moves the upper clamp 262 to the rear and moves a second rear-door block 264. The second rear-door block 264 also rides on the guide rod 246. Brackets 266 connected to the rear block 264 mount the rear door 140R for movement guided by the guide rod 246.

As a result, one motion of the piston rod 240 results in oppositely directed movements of the doors 140, in this example, to move the doors 140 apart and expose an upper opening 268 (FIG. 9D) of the chamber 144. In an opposite example, when the piston rod 240 is driven by the main motor 234 toward the rear, the front force transfer block 244 rides toward the rear on one of the two door guides 246. As the front block 244 is moved toward the rear and correspondingly moves the lower belt clamp 250 toward the rear, the lower clamp 250 moves the lower run 254 of the belt 252 toward the rear. The rearward motion of the piston rod 240 causes the upper run 260 of the belt 252 to move toward the front. As a result, the upper clamp 262 secured to the upper run 260 is moved by the upper run 260 toward the front and moves the second rear-door block 264 toward the front. The brackets 266 connected to the rear block 264 move the rear door 140R forwardly toward the oppositely (now-rearwardly) moving front door 140F. As a result, the one rearward motion of the piston rod 240 results in oppositely directed movements of the doors 140F and 140R, in this example, to move the doors toward each other and close the upper opening 268 of the chamber 144.

FIG. 7 depicts the bottom 168 of the chamber 144 as having an outwardly extending chamber flange 270. The chamber flange 270 extends along the length L of the chamber and is provided with a series of the gas outlets 162, each in the form of an aperture 272 shown in FIG. 7. The exhaust manifold 170 also extends along the length L of the chamber 144 and collects the gas 160 from the gas outlets 162. The flange 210 of the tank 212 is shown under an outer portion 274 of the chamber flange 270. A gasket 276 (such as PTFE sold under the trademark GORE-TEX), and a series of bolts 278 sealingly connect the chamber flange 270 to the tank flange 210 so that the tank 212 is supported on the chamber 144. Respective outer and inner walls 280 and 282 of the tank 212 extend from the tank flange 210. The inner wall 282 is secured, as by welding, to the elongated walls 204 of the bath 194 to support the bath.

Figure 8:
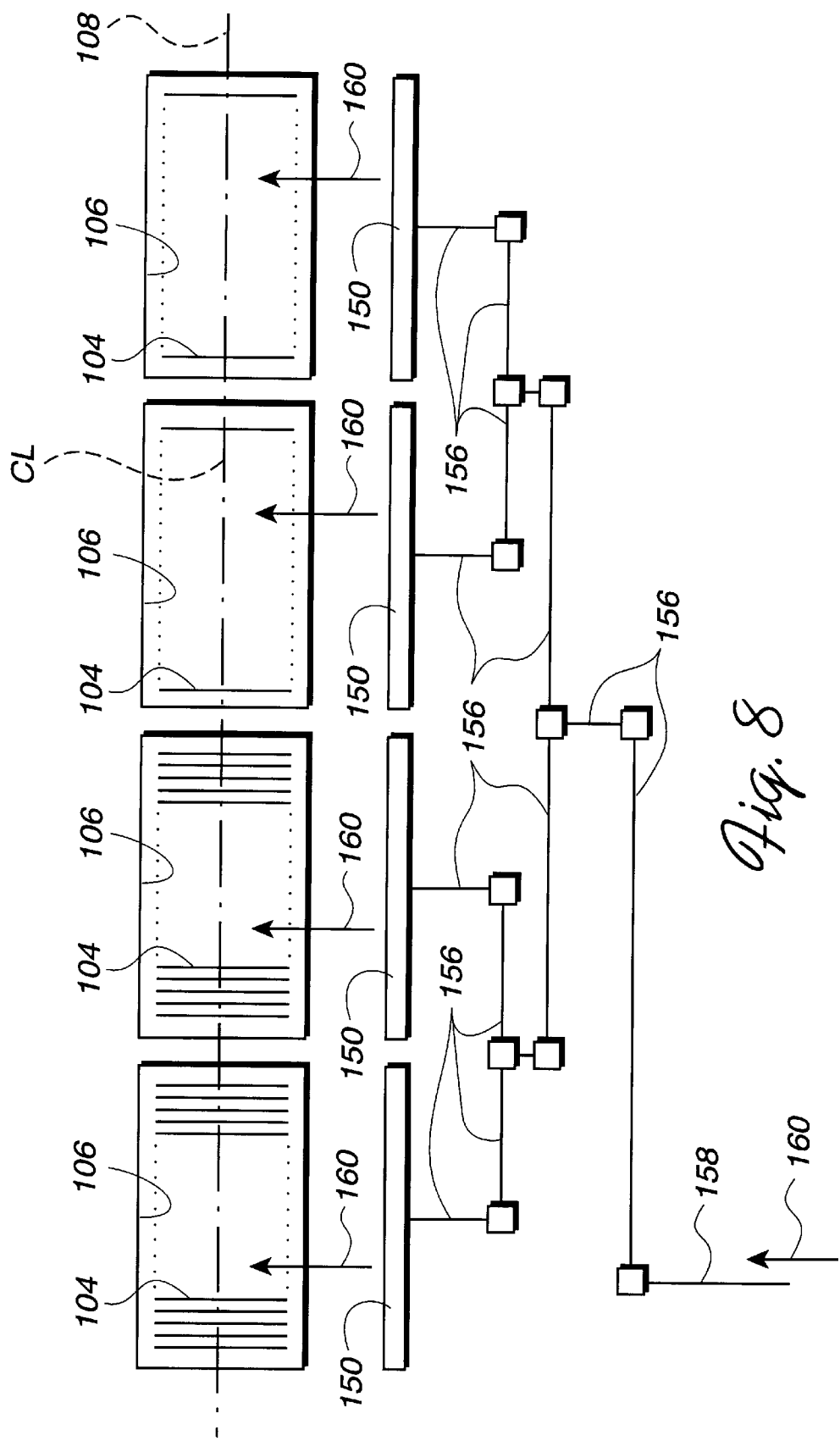
FIG. 8 is a schematic view of a gas supply subsystem for feeding hot gas to gas inlets of opposite sides of the chamber.

FIG. 8 shows a plan view of the gas supply system 154 as including the pipes 156 extending from the gas main 158. The pipes 156 branch appropriately to supply the gas 160 to the four gas inlets 150 on each side of the opening 268 of the chamber 144. For ease of illustration, only the four gas inlets 150 on one side of the chamber 144 are shown in FIG. 8.

Figure 9A:
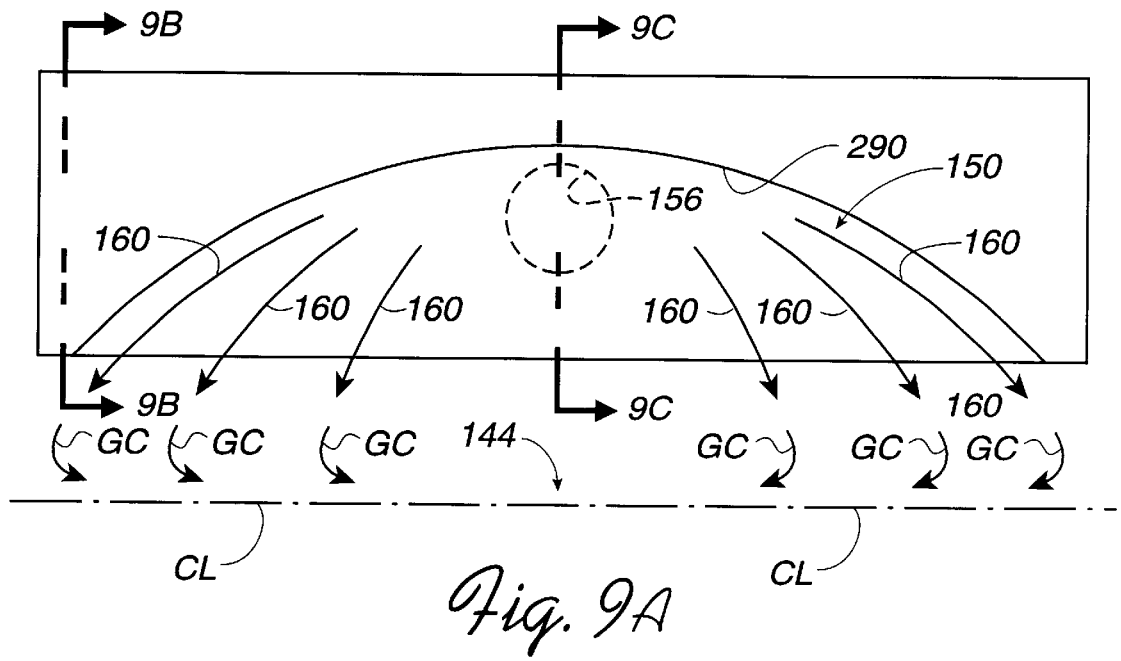
FIG. 9A is a plan view of one of the gas inlets showing a curved configuration of a diffuser for laterally spreading the gas received from an inlet pipe.
Figures 9B, 9C:
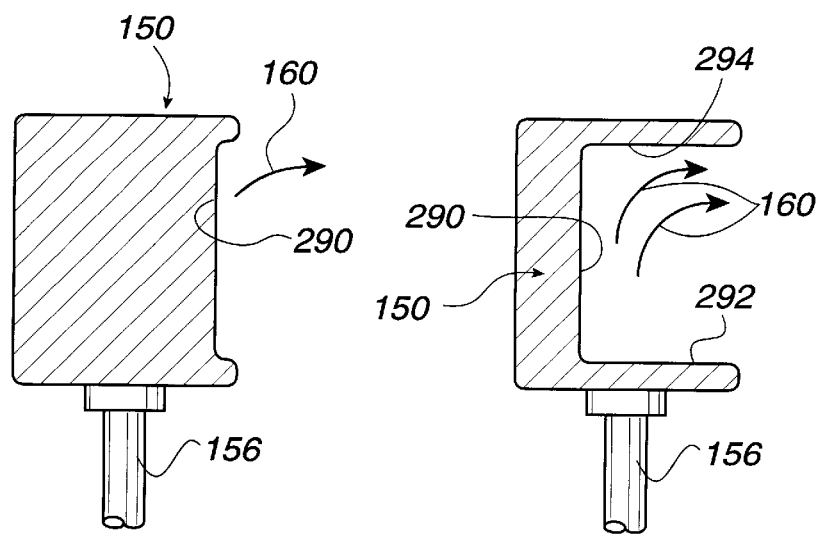
FIG. 9B is a cross sectional view taken along line 9B—9B in FIG. 9A, showing one end of the gas inlet.
FIG. 9C is a cross sectional view taken along line 9C—9C in FIG. 9A, showing the center of the gas inlet.

Each of the gas inlets 150 has the configuration shown in FIGS. 9A through 9C. FIG. 9A shows in plan view a gas inlet 150 elongated in the direction of the length L (longitudinally) and having a curved rear wall 290 also extending generally longitudinally. The last gas supply pipe 156 joins the gas inlet 150 from the bottom 292 and as shown in FIG. 9C directs the gas 160 against an opposite upper surface 294. The gas flow is directed off the upper surface 294 and the curved rear wall 290 to the center (see line CL) of the chamber 144 and is also spread longitudinally by the curved rear wall 290. As a result, the gas inlets 150 on one side of the chamber 144 spread the gas 160 longitudinally and evenly across the length L of the chamber 144.

Figure 9D:
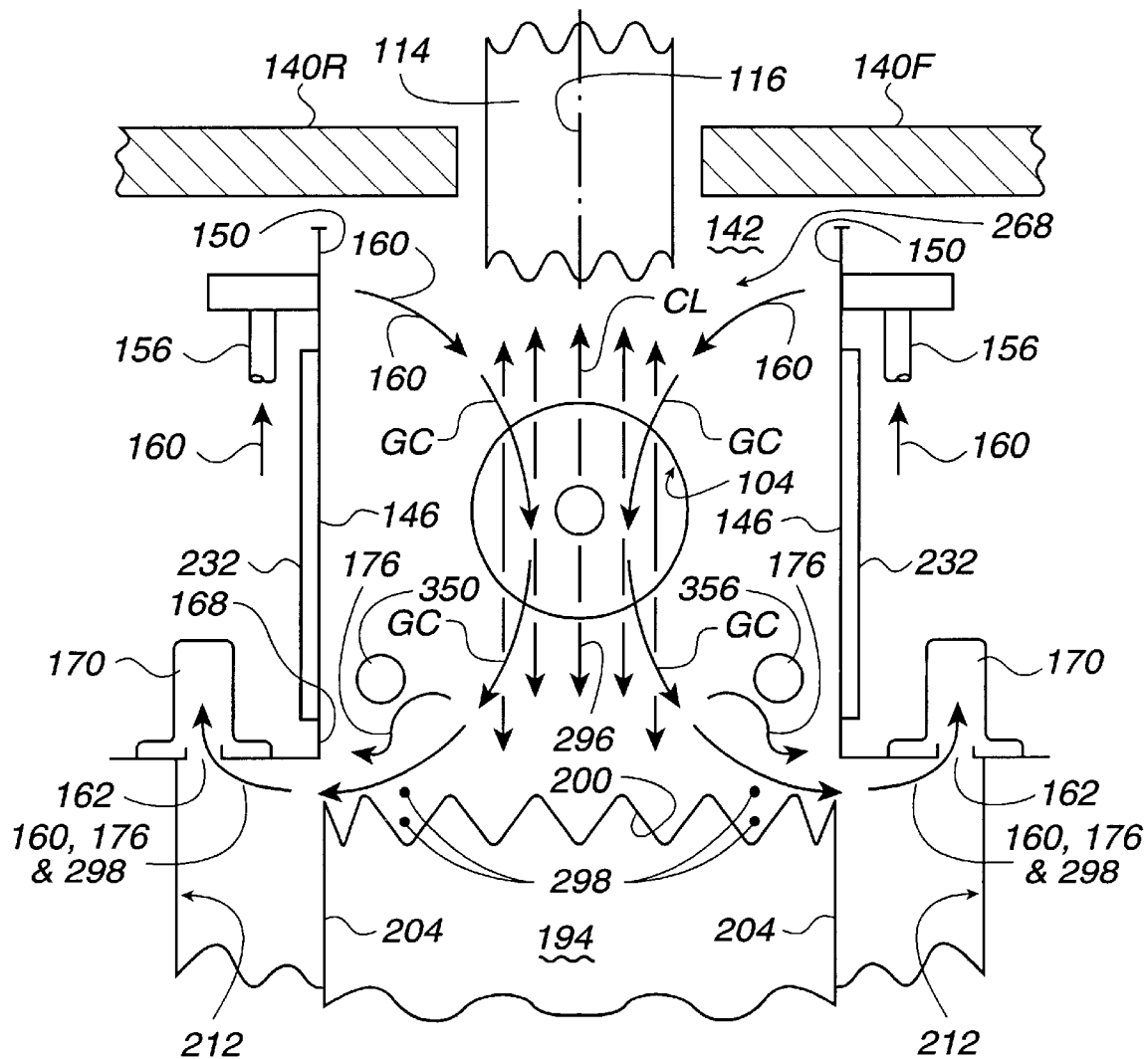
FIG. 9D is a schematic elevational view showing gas curtains flowing between the substrates in the chamber.

FIG. 9D shows that the incoming gas 160 from the gas inlets 150 flows downwardly within the chamber 144 to define a plurality of gas curtains GC. The gas curtains GC flow continuously and downwardly adjacent to the center CL of the chamber 144 and intersect substrate movement paths 296 along which the batches 102 of substrates 104 move in the drying operations. Because the substrates 104 are positioned as shown in FIG. 1A extending across the chamber 144 from one elongated wall 146 to the opposite elongated wall 146, the gas curtains GC flow from the gas inlets 150, between the adjacent substrates 104 that are carried by one of the carriers 106, and then out from between the adjacent substrates 104 and downwardly. When the substrates 104 are positioned above the bath 194 and in the chamber 144 during and just after being pulled from the bath 194, the flow of the gas curtains GC between the adjacent substrates 104 assists in evaporating the liquid 192 from the substrates 104, and carries the evaporated liquid 192 downwardly in the chamber 144 past the substrates 104. FIG. 9D shows that after the gas curtains GC exit the spaces between the adjacent substrates 104, the gas curtains GC include the air-borne fluid vapor 176, which is evaporated liquid vapor from the substrates 104 (see the arrows 176).

As the batches 102 of substrates 104 are pulled upwardly in the chamber 144 out of the liquid 192 and through the chamber 144 toward the top opening 268, the variable speed fan 174 is operated at a speed selected to produce reduced gas pressure at the base 166 of the elongated chamber 144, and specifically reduced pressure downstream of the gas outlets 162. As a result of the reduced pressure, after the gas curtains GC (with the vapor 176) exit the spaces between the adjacent substrates 104, the gas curtains GC (with the vapor 176) flow away from the center CL of the chamber 144 and to the gas outlets 162. In this manner, not only is the evaporated liquid vapor 176 carried with the gas curtains GC, but any liquid vapor (see dots 298) that is emitted from the bath 194 upwardly past the upper end 198 of the weir 200 is carried by the gas curtains GC away from the bottom 168 of the chamber 144 and directly to the gas outlets 162. As a result, little if any of the liquid vapor 298 emitted by the bath 194 will rise above the bottom 168 of the chamber 144. Rather, the primary source of liquid vapor in the chamber 144 will be the evaporated liquid vapor 176 that evaporated from the opposite sides of the substrates 104, and such evaporated liquid vapor 176 and any liquid vapor 298 both flow with the gas curtains GC directly to the gas outlets 162 and not up in the chamber 144.

FIG. 10 depicts one of the carriers 106 having a plurality of spaced bars 300 configured for limited contact with each substrate 104. The bars 300 extend parallel to the length L of the chamber 144. Opposed end plates 302 hold the bars 300 in position to contact the substrates 104. An upper surface 304 of each bar 300 has a generally saw tooth configuration that defines a series of V-shaped notches 306. Each notch 306 is configured to receive and hold a substrate 104 in a vertical position while making minimal contact with the substrate. In particular, FIG. 11A shows one of the bars 300 as having an enlarged base 308 provided with holes 310 for receiving either a pin or a fastener 312 (FIG. 10) to secure the bar 300 to the end plates 302. At the top of the enlarged base 308, a thin substrate holder section 314 is shown having opposite parallel left and right sides 316 and 318 respectively. The V-shaped notches 306 extend from the left side 316 through the thin section 314 to the right side 318. FIG. 1A shows that a bottom 320 surface of the V-shaped notches 306 is beveled, e.g., is formed at an angle VB relative to vertical. FIG. 11B shows that the "V" of the notches 306 is formed at an angle VA, half of which is on either side of vertical. Additionally, a pitch P from one V-shaped notch 306 to the adjacent V-shaped notch 306 is selected according to the thickness of the particular substrates. As a result of this configuration and spacing (pitch P) of the V-shaped notches 306, a particular substrate 104 (shown in FIG. 11C as an exemplary disk 120) only touches the notch 306 at two points 322A and 322B. The two points 322 are at the left side 316 of the thin section 314. Because the bottom surface 320 of the notches 306 is beveled (and thus formed at the angle VB with respect to vertical), the portions of the bottom surface 320 and the sides of the notches 306 to the right of the left side 316 are below the edge (i.e., 128 or 136) of the substrate 104 and do not touch the substrate 104. Thus, the angle VA of the notch 306, and the angle VB of the bevel 300 of the bottom surface 320 of the notch 306 combine to minimize the amount of contact between each bar 300 of the carrier 106 and each one of the substrates 104, such that only the two points 322A and 322B of each carrier bar 300 contact the substrate 104, i.e., only at the left side 316. Further, any liquid 192 that is on the substrate 104 or on the surface of the thin substrate holder section 314 will tend to flow away from the substrate 104. In particular, because the left side 316 of the section 314 is vertical, liquid 192 will flow from the left side 316 downwardly onto the base 308 of the bar 300 and off the bar. Similarly, because of the bevel, or angle VB, of the bottom surface 320 (e.g., sixty degrees from horizontal), any liquid 192 that drains from the substrate 104 to the right of the left side 316 will flow down the beveled bottom surface 320 and away from the substrate 104. Importantly, because of such vertical and beveled orientations, it is unlikely that the liquid 192 will form a puddle or otherwise accumulate at the points 322A or 322B at which the V-shaped notch 306 and the edge 128 or 136 contact each other, such that it is very unlikely that a mouse-ear will form on the substrate 104. It may be understood that the size of the substrates 104 being dried, e.g. the diameter and thickness, may be taken into consideration in determining the values of the angles VA and VB, and of the pitch P. For exemplary substrates 104 in the form of the disks 120 having a thickness of 0.80 millimeters and a diameter of 95 millimeters, for example, the angle VA may be about one hundred nine degrees, the angle VB may be about thirty degrees, and the pitch P may be 0.250 inches.

Figure 13:
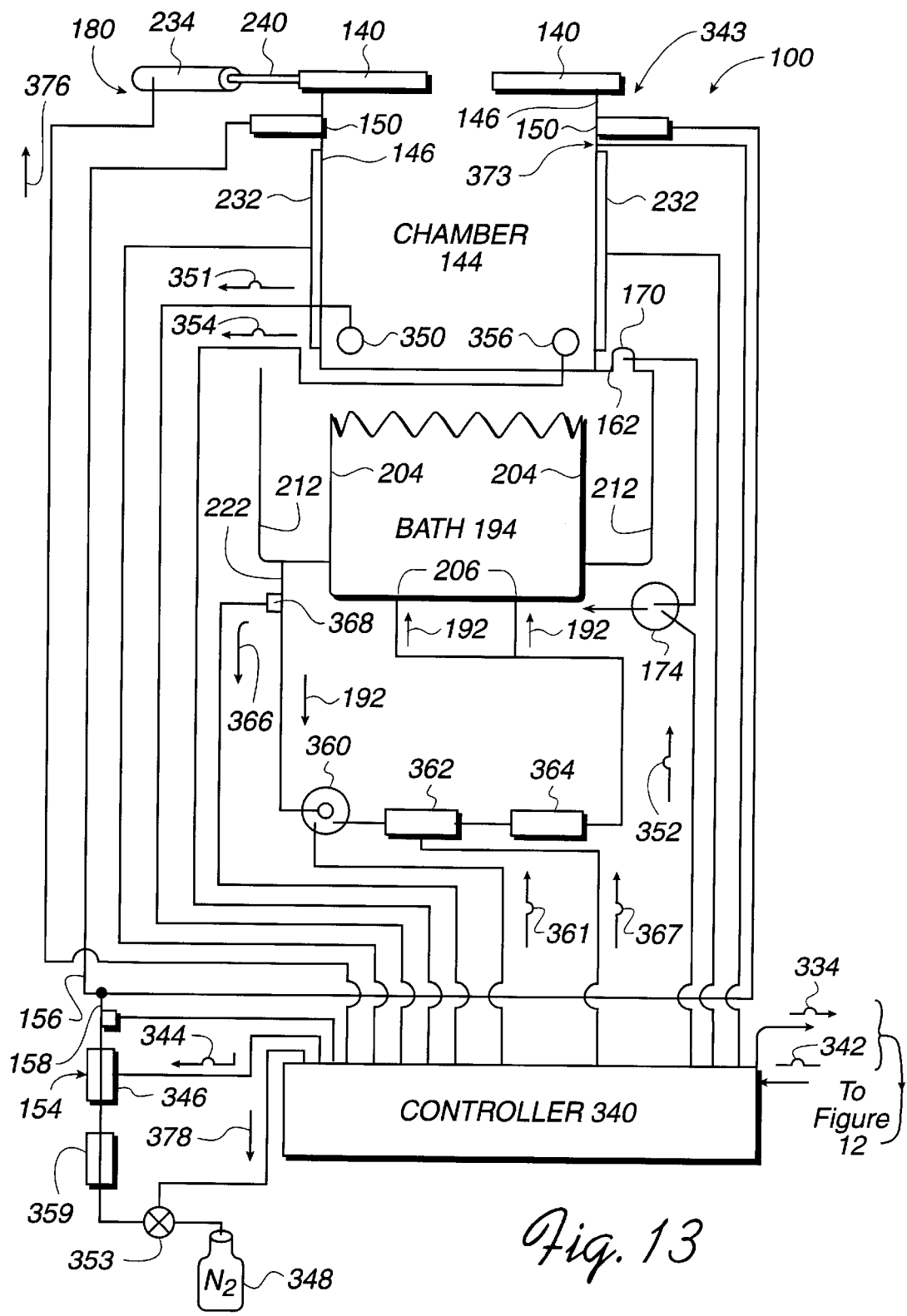
FIG. 13 is a schematic diagram of a control circuit that supplies data to the controller for synchronizing the various operations of the apparatus.

FIG. 12 shows the side of the apparatus 100 for drying the batches 102 of substrates 104, illustrating a drive 330 for moving the main column 114 and the arm 112 that carries the carriers 106. The drive 330 includes a standard servo motor 332 for accurately moving the main column 114 in response to signals 334 from a controller 340 (FIG. 13). The servo motor 332 may be a Model MAC-B231-NF40-C1unit made by API and having (not shown) a lead screw and a servo feedback loop providing signals 342 to the controller 340. As described in more detail below, the controller 340 causes the servo motor 332 to operate at different speeds according to which of many parts of a drying operating cycle is being performed.

FIG. 13 is a schematic diagram of a control circuit 343 for controlling the operation of the system 100. The controller 340 may be a programmable controller such as Model No. 2700 controller made by CTC. The controller 340 is shown controlling the operation of the wall heaters 232. Also, the controller 340 provides a control signal 344 to a heater 346 that heats the gas 160 supplied from a gas tank 348. The gas tank 348 preferably supplies inert gas 160. More preferably the gas tank 348 supplies the nitrogen as the gas 160. Most preferably, the gas tank 348 and the heater 346 supply heated nitrogen gas 160 to the inlets 150. A gas curtain temperature sensor 350 is provided in the chamber 144 at about 0.83 inches above the bottom 168 of the chamber 144. As described below, during the pull of the carrier 106 and the batches 102 of substrates 104 from the fluid 192 there is no re-circulation of the fluid, such that the top fluid surface 196 becomes very smooth, and drops to about 0.54 inches below the saw tooth top of the weir 200. With the gas curtain temperature sensor 350 at the noted location, the gas curtain temperature sensor 350 is in position to accurately monitor the temperature of the gas curtains GC flowing downwardly to the gas outlets 162 during the pull operation. The controller 340 responds to an output signal 351 from the sensor 350 and causes the gas heater 346 and the wall heaters 232 to appropriately increase or decrease the thermal energy provided by each sufficient to maintain the gas curtains GC at a desired temperature. For drying substrates 104 in the form of the disks 120 made from aluminum and having a diameter of about 95 mm and a thickness of about 0.80 mm., for example, the heated nitrogen gas 160, for example, may be maintained at a temperature in a range from about eighty to one hundred degrees C., and may preferably be maintained at about ninety degrees C. as measured by the gas sensor 350. The preferred ideal temperature will depend on the temperature of the fluid 192 at the top fluid surface 196, which as described below, is about eighty-five degrees C. The gas temperature measured by the gas sensor 350 should be above the temperature of the fluid 192 at the top fluid surface 196, and may be in the range of from about one to twenty degrees C. in excess of the temperature of the fluid 192 at the top fluid surface 196. Preferably the amount of the excess is about ten degrees C., but should not be so high as to cause the fluid 192 at the top surface 196 to boil.

For the same substrates 104, the wall heater 232 may be maintained at a temperature in the range of about eighty to one hundred fifty degrees C., and preferably at about one hundred ten degrees C. As another example, for the ninety degree C. gas curtain temperature measured by the sensor 350, the temperature of the gas output from the gas heater 346 may be about one hundred seventy degrees C.

The controller 340 also provides a control signal 352 to the variable speed fan 174 that is connected to the exhaust manifold 170. In response to an output signal 354 from a relative humidity sensor 356 positioned about one inch above the bottom 168 of the chamber 144, the controller 340 adjusts the speed of the fan 174, which increases or decreases the relative humidity. For example, the relative humidity may be controlled so as to be in a range of from about less than forty percent. A thirty percent relative humidity is preferred for the above-described disks 120, for example.

The controller 340 may also control the flow of the gas 160 by regulating an output valve 353 attached to the gas tank 348. In substrate drying operations, the gas flow may be in the range of one to ten cubic feet per minute (CFM), with a rate of five CFM being preferred for a chamber 144 used to dry four batches 102 (e.g., the exemplary one hundred) of the above-described disks 120 in one operational cycle. Preliminary to an actual drying operation, for example when the batches 102 of substrates 104 are being introduced to the chamber 144 and moved into the bath 194, the controller 340 may decrease the gas flow rate to the lower end of that range so that the gas curtains GC will not cause the upper surface 196 of the liquid 192 in the bath 194 to splash or otherwise be disturbed. In this manner, the amount and location of the liquid 192 applied to the opposite sides 124 or 132 of the substrates 104 will be controlled by controlling the rate of movement of the batches 102 of substrates 104 into the bath 194.

The controller 340 may also control the flow rate of the liquid 192 into the bath 194. For this purpose, the controller 340 may send a signal 361 to a pump 360 that receives recirculated liquid 192 from the recirculating drains 222, and supplies the liquid 192 to a liquid heater 362 and to a filter 364. The filter 364 may be a 0.05 micron PTFE filter made by Pall Corporation, for example. Such filter 364 is designed to leave in the filtered liquid 192 only five 710.03 micron particles per cubic centimeter of filtered liquid. In response to an output signal 366 from a temperature sensor 368 attached to the recirculating drain 222, the controller 340 provides a signal 367 to the liquid heater 362 to maintain the liquid 192 in the bath 194 in the range of about eighty to eighty-five degrees C. Preferably, the temperature of the liquid 192 sensed by the sensor 368 is about eighty-five degrees C. Also, the preferred temperature at the top fluid surface 196 is about eighty-five degrees C.

The controller 340 may also control the operation of the pneumatic motor 234 that opens and closes the doors 140. At the start of an operational drying cycle, by a signal 376 the controller 340 causes the motor 234 to move the piston rod 240 to the right as viewed in FIG. 6A to open the doors 140. When the servo motor 332 has caused the carrier 106 to position the batches 102 of substrates 104 below the doors 140, the feedback signal 342 from the servo motor 332 to the controller 340 causes the controller 340 to actuate the motor 234 to close the door 140. At the end of the drying cycle, when the carrier 106 has been positioned in the chamber 144 just below the doors 140, the feedback signal 342 is provided from the servo motor 332 to the controller 340. In response, the controller 340 generates the signal 376 to cause the motor 234 to open the doors 140.

Another function of the controller 340 is to activate an anti-static device 373 that creates a charge at the points at which the nitrogen gas 160 is introduced into the inlets 150 to prevent static charge from existing in the chamber 144.

Yet another function of the controller 340 is to provide the operating signals 334 to the servo motor 332 for moving the carrier 106 and the batches 102 of substrates 104. At the beginning of an operational drying cycle, after the doors 140 are open, the controller 340 receives the feedback signal 342 from the servo motor 332 indicating that the arm 112 is up, out of the chamber 144. The controller 340 then causes the servo motor 332 to lower the carrier 106 and the substrates 104 into the chamber 144 and then into the bath 194 to the deep immersion depth. The servo motor sends the signals 342 to the controller 340 when the carriers 106 have moved lower than the doors 140. In response, the controller 340 causes the motor 234 to close the doors 140. The servo motor 332 sends the signals 342 when the deep immersion depth has been reached, and in response the controller 340 sends the signal 334 causing the servo motor 332 to stop. The controller 340 may then cause the servo motor 332 to pull the carrier 106 upwardly in the bath 194 and in the chamber 144, and eventually out of the chamber 144 in coordination with operation of the doors 140.

Figure 14:
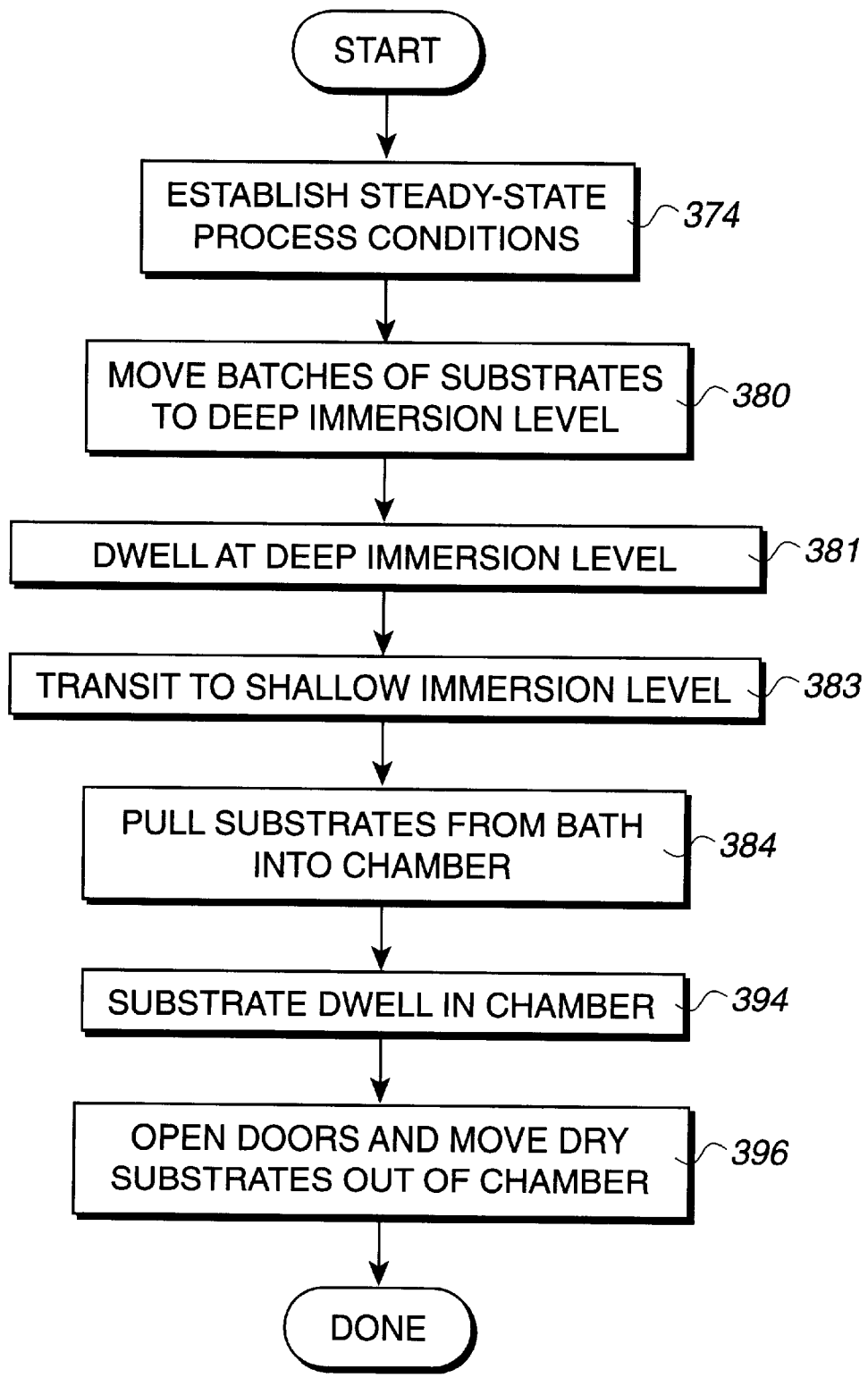
FIG. 14 depicts a flow chart showing operations of a first method for simultaneously drying a plurality of batches of substrates.

FIG. 14 shows a flow chart depicting a process of drying batches 102 of the substrates 104 according to the present invention. The process starts with a first operation 374 in which steady-state process conditions are established. In detail, the controller 340 is programmed to set up the process conditions described above. These include: (1) the flow, temperature and monitoring of the nitrogen temperature, (2) the flow, heating and monitoring of the fluid temperature, (3) operation of the heaters 232 for the walls 146 and 148, (4) turning on the sensors 350, 356, 368, 370, for example, to monitor appropriate conditions, (5) monitoring the relative humidity, and (6) operating the fan 174.

With the steady-state process conditions established, an operation 380 is performed. The controller 340 sends the signal 376 to the motor 234 to cause the motor 234 to open the doors 140. The batches 102 of substrates 104 have been loaded into the carriers 106 and the carriers 106 have been loaded onto the fingers 110. The nitrogen valve 353 is set by a signal 378 from the controller 340 to provide the low gas flow rate described above. The controller 340 then causes the servo motor 332 to lower the carrier 106 and the batches 102 of substrates 104 into the chamber 144. The servo motor 332 sends the signal 342 to the controller 340 indicating that the carrier 106 and the batches 102 are completely in the chamber 144, past the doors 140. The controller 340 then causes the motor 234 to close the doors 144.

Figure 15A:
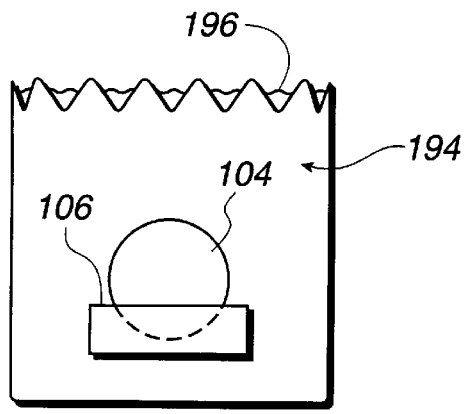
FIGS. 15A through 15D are schematic views of an end of the apparatus, showing various positions of one of the carriers and the batch of substrates in that carrier.

FIG. 15A shows the substrates 104 in the process of being submerged to the deep immersion position, or depth. When the substrates 104 have been fully submerged in the fluid 192, the servo motor 332 sends the signal 342 to the controller 340, and in response via the valve 353 the controller causes the gas flow rate to be increased to the preferred amount for drying. The controller 340 also causes the servo motor 332 to move the batches 102 of substrates 104 to the deep immersion depth, which is at least one inch below the top surface 196 of the fluid in the bath 194, and depending on the sizes of the bath 194 and the substrate 104 may be up to two inches below the top surface 196.

In an operation 381, the servo motor 332 sends the signal 342 to the controller 340 indicating that the batches 102 of substrates 104 are at the deep immersion depth. In response, the controller 340 causes the servo motor 332 to stop, or dwell. At the deep immersion depth, the planar sides 124 or 132 and the edges 128 or 136 of the substrates 104 are now not only wet in a uniform manner, but wet by the very clean, filtered and heated fluid 192. The substrates 104 receive thermal energy from the fluid 192. The dwell time at the deep submergence depth is about from ten to thirty seconds. The dwell time should be long enough to allow the fluid 192 in the bath 194 to flow over the substrates 104 and remove any particles (not shown) remaining on the substrates 104 for collection by the filter 364 and to allow the temperature of the substrates 104 to increase as desired to condition the substrates 104 for being dried. By the end of the dwell time the temperatures of the opposite sides 124 or 132 of the substrates 104 increase to about the temperature of the fluid 192, such as at the top surface 196. Such temperature is described above as being about eighty-five degrees C., and conditions the substrates 104 for being dried as the substrates 104 exit the bath 194.

Figure 15B:
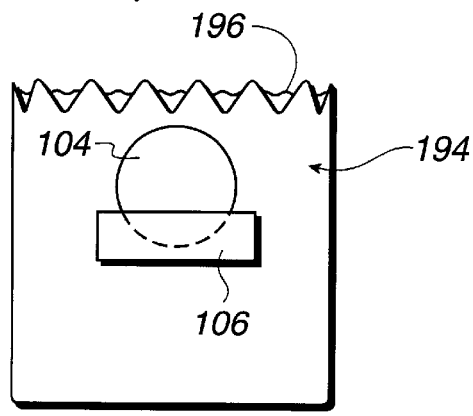

FIG. 15B shows that at the end of the dwell time, operation 383 is performed by the controller 340 sending the signal 334 to cause the servo motor 332 to transit the carrier 106 and the batches 102 of substrates 104 upwardly in the bath 194 to the shallow immersion depth, which is just under the top surface 196. The time period of this transit is about less than one second to about two seconds. The transit to the shallow immersion depth decreases the overall time required for the drying process since the subsequent substrate pull operation does not have to move the substrates 104 from the deep immersion depth, but instead immediately starts to remove the substrates 104 from the fluid 192 into the chamber 144.

When the substrates 104 arrive at the shallow immersion depth, the servo motor 332 sends the signal 342 to the controller 340, and in response, operation 384 is performed. Initially, to establish proper conditions for pulling the substrates 104 out of the fluid 192, the controller 340 sends the signal 361 to the fluid pump 360 to stop the pump. With the pump 360 stopped, there is no re-circulation of the fluid, such that the top fluid surface 196 becomes very smooth, or glass-like. Further, the controller 340 continues to monitor the temperature and relative humidity conditions in the chamber 144, and to make the above-described adjustments as may be necessary.

Figure 15C:
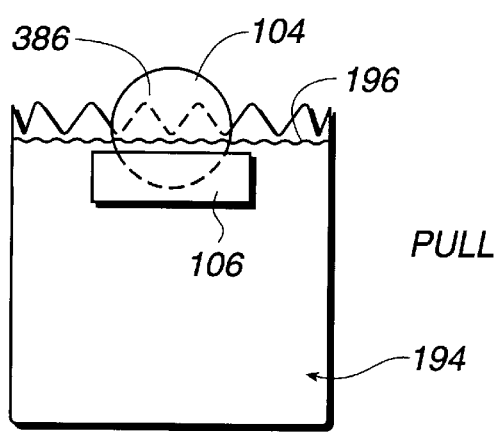
Figure 16A:
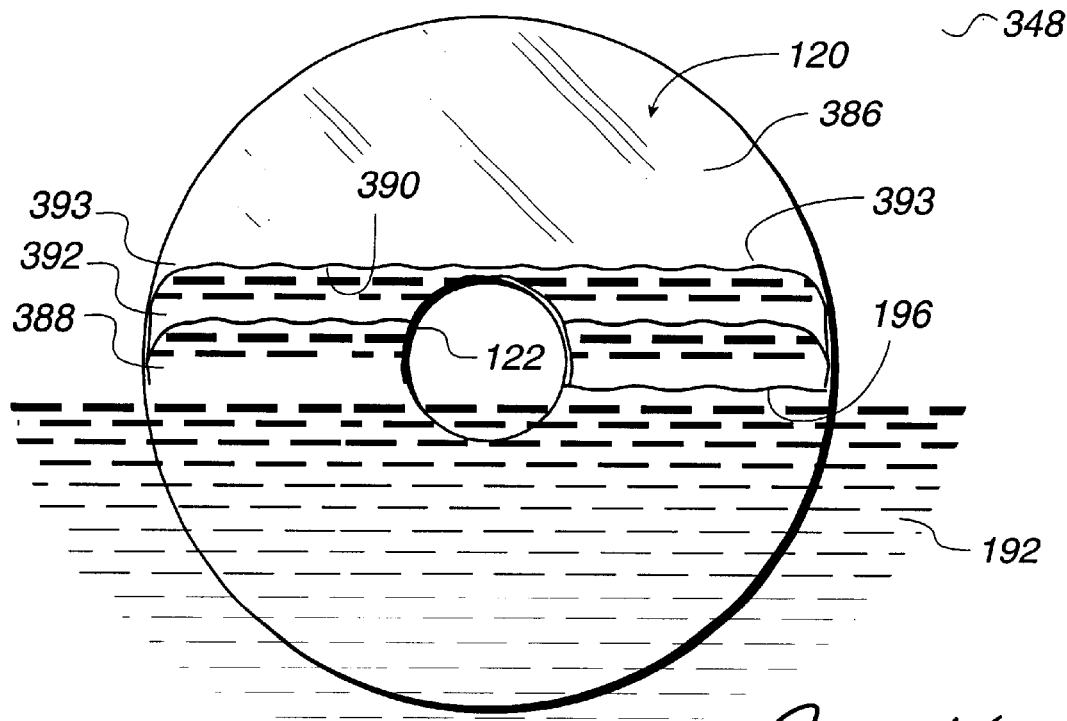
FIG. 16A is a schematic diagram of the surface of a substrate during the pull operation, illustrating a meniscus and a thin film.
Figure 16B:
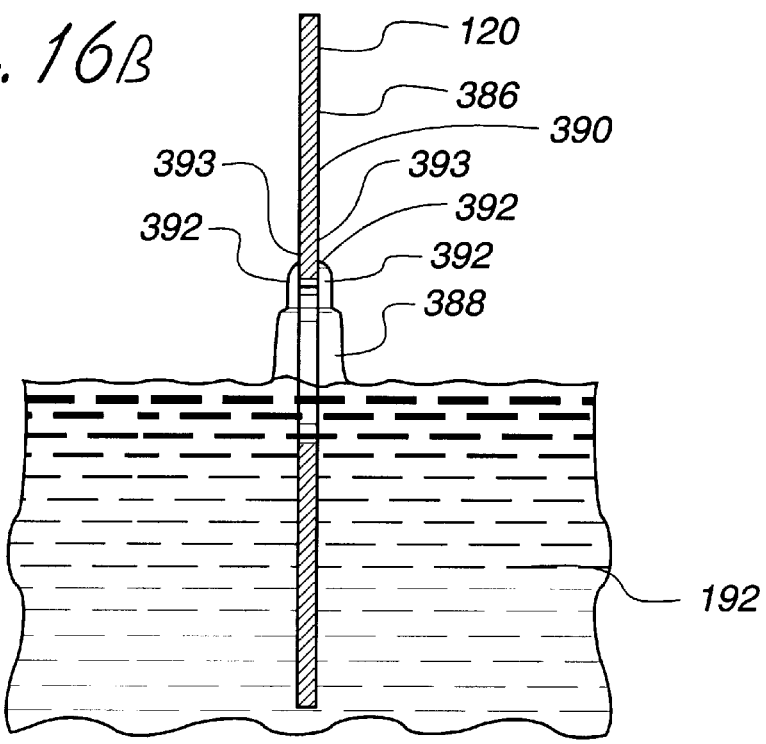
FIG. 16B is a schematic diagram of an end view of a substrate during the pull operation.

FIG. 15C shows that in operation 384, the controller 340 causes the servo motor 332 to pull the batches 102 of substrates 104 from the bath 194 at a constant rate in the range of about 0.5 to 2.5 mm per second, for example. FIGS. 15C, 16A, and 16B show that the pull at the constant rate results in an increasingly large portion 386 of the substrates 104 being out of the fluid 192. The now-very smooth top fluid surface 196 through which the substrates 104 are pulled on the way out of the fluid 192 promotes formation of a meniscus 388 (shown in FIG. 16A by cross hatching between two lines) between the top fluid surface 196 and each of the opposite planar sides 124 or 132 of each substrate 104. The meniscus 388 extends upwardly from the upper surface 196 and is in effect a localized vertically extending minute section of the fluid 192 located above the upper surface 196. The meniscus 388 terminates at a rounded nose 390 (FIG. 16B). The meniscus 388 may extend about less than one mm. from the top fluid surface 196 to the nose 390. Additionally, as the substrates 104 are pulled upwardly through the smooth top fluid surface 196 and become separated from the fluid 192, a thin film, or monolayer, 392 of the fluid 192 forms on each side 124 or 132 of each substrate 104 above the meniscus 388. The thin film 392 may be from about 0.5 mm. to 0.005 mm. in height from the nose 390 to a point 393 (FIG. 16A) of complete evaporation of the thin film 292, for example. Generally, the thin film 392 may exist only during a very brief time period (e.g., from about 0.001 seconds to about 0.6 seconds) before it evaporates under the steady-state conditions established and maintained in the chamber 144. The formation of the meniscus 388, and the resulting thin film 392 retained on each side 124 or 132 of each substrate 104, and the very rapid evaporation of the thin film 392 from each side 124 or 132 of each substrate 104, are desirable. In particular, the thin film 392 on each side 124 or 132 is of uniform thickness, the fluid 192 composing the thin film 392 is very clean, and the thin film 392 is removed by the very rapid evaporation, which promotes the efficient removal of the thin film 392 according to the present invention, leaving no stains of other marks from drying of the fluid 192.

To increase the number of substrates 104 that may be processed per hour using the apparatus 100 and method of the present invention, a rate of upward movement of the servo motor 332 may be selected over a range of from about 48 mm. to 200 mm. per minute. This rate of movement is selected according to the characteristics of the (a) substrates 104 that are to be carried in the carrier 106, and (b) fluid 192 in the bath 194. More particularly, for each combination of substrates 104 and fluid 192, there is a maximum rate of movement of the substrates 104 out of the bath 194 at which the meniscus 388 and the thin film 392 of fluid 192 will form on each side 124 or 132 of the substrates 104. It is undesirable for the servo motor 332 to move the carrier 106 out of the bath 194 at a rate greater than this maximum rate of movement of the substrates 104 out of the bath 194. In detail, if this rate is exceeded, then the meniscus 388 and the thin film 392 will become discontinuous. The discontinuous meniscus and thin film 392 do not uniformly wet each side 124 or 132 of the substrates 104, such that undesirable uneven drying and staining of the sides 124 or 132 may occur.

Referring to FIG. 16A, it may be understood that above the thin film 132 on each side 124 or 132 of each substrate 104 the substrate is dry. The controller 340 continues to monitor the signals 354 from the relative humidity sensor 356, and to control the speed of the fan 174 to avoid recondensation of the vaporized fluid 176. FIGS. 7 and 9D show that the effect of excessively high relative humidity (e.g., promoting recondensation of the vaporized fluid 176 onto the dried substrates 104) is avoided by controlling the operational speed of the exhaust fan 174 to draw the fluid-vapor-laden gas 160 (the gas 160 and the vapor 176 from the evaporated fluid 192) from the volume adjacent to the bottom 168 of the chamber 144 where the substrates 104 are still initially being dried and to draw any liquid vapor 298 directly into the gas outlet 162. The relative humidity in the chamber 144 is controlled by the speed of the fan 174 to provide the above-described preferred relative humidity, to avoid such recondensation, and to avoid condensation of such vapor 298 on the substrates 104.

Figure 15D:
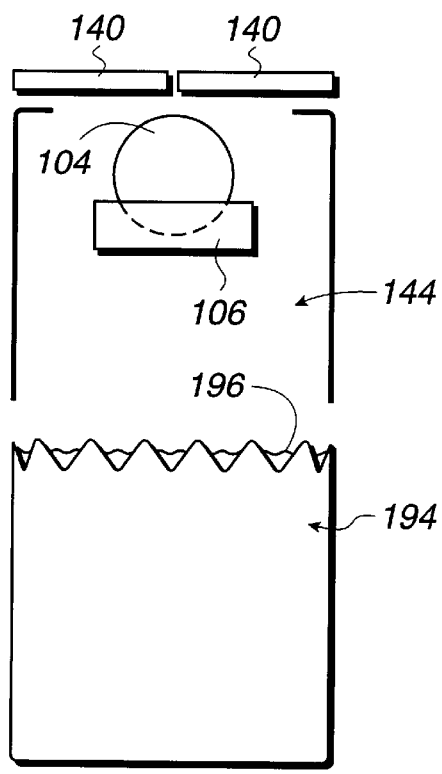

FIG. 15D shows that at the end of the pull of operation 384, the carrier 106 is positioned in the chamber 144 just below the doors 140. At this time, operation 394 is performed. In operation 394, the servo motor 332 outputs the signal 342 to the controller 340. In response, the controller 340 sends the signal 334 to cause the servo motor 332 to stop, or dwell. The duration of the dwell adjacent to the closed doors 140 may vary from zero to fifteen seconds, depending on the nature of the fluid 192, for example. When the fluid 192 is de-ionized heated water, for example, the duration of the dwell may be very short (e.g., zero or a mere pause to allow the doors 140 to be opened). In the case of fluids 192 other than de-ionized water a longer dwell period may be used. If it is determined that the particular fluid 192 has not dried from the carrier 106 during the drying cycle, such that by the time the carrier 106 arrives below the closed doors 140 at the end of operation 384 the carrier 106 is still wet with the fluid 192, then the duration of the dwell at the doors 140 may be adjusted to assure that no drops of the fluid 192 are on the carrier 106 before the doors 140 are opened.

Following the desired duration of the dwell, the controller 340 sends the signal 376 to the motor 234 to cause the motor 234 to open the doors 140. The controller 340 also sends the signal 334 causing the servo motor 332 to pull the carrier 106 and the dried substrates 104 completely from the chamber 144, at which time the substrate drying process is done.

Efficient removal of the fluid 192 from the substrates 104 is achieved by the transfer of thermal energy to the substrates 104 and to the thin film 392 of fluid 192 as the substrates 104 and the bath 194 are separated. An initial input of thermal energy to the substrates 104 is from the heated fluid 192. A further input of thermal energy to the substrates 104, and to the thin films 392 on the substrates 104, is from the heated gas 160 flowing in the chamber 144. FIG. 13 shows that the gas 160 receives thermal energy from the gas heater 346. A further input of thermal energy to the substrates 104, and to the thin films 392, is from the walls 146 and 148 of the chamber 144. FIG. 9D shows that the walls 146 of the chamber 144 are provided with the flat heaters 232, and the walls 148 are provided with the flat heaters 232 in a similar manner. With the walls 146 and 148 at the temperature described above, the gas 160 flowing in the flow curtains GC may contact the walls 146 and 148 and receive thermal energy. With the walls 146 and 148 at the selected temperature, the walls 146 and 148 also transfer radiant thermal energy to the substrates 104 and to the thin films of fluid 392 on the substrates 104 as the substrates 104 are pulled from the bath 194 into and through the chamber 144. The radiant thermal energy helps assure that the temperature of the substrates 104 and of the thin films 392 does not decrease as the substrates 104 are moved from the bath 194 into and through the chamber 144

As noted, prior to the present invention, there was a need for apparatus and methods of efficiently drying the substrates 104. The efficient drying resulting from use of the present invention allows the substrates 104 to be separated from the fluid 192 at the described selected rate which is no less than the maximum rate at which a meniscus 388 will form between the fluid 192 and the sides 112 of the substrates 104. As a result, the overall period of time taken in the typical drying cycle described with respect to FIG. 14 may not exceed about two minutes. To not exceed such time period, the drying cycle rapidly removes from the substrates 104 the thin films 392 of the fluid 192 that are uniformly formed on the substrates 104 as the substrates 104 and the bath 194 are separated. As described above, "rapidly" means that such removal occurs in less than a second as the substrates 104 are pulled from the fluid 192.

In review, then, the present invention fills these needs by providing the apparatus 100 and the described methods of efficiently removing the fluid 192 from the substrates 104. The efficient removing uniformly wets the substrates 104 in the fluid 192 so that a consistent starting condition of the substrates 104 is provided regardless of the type of prior processing of the substrates 104. In addition, the efficient removing is attained by defining a gas-filled volume, which is provided by the hot chamber 144 that continuously transfers thermal energy to the substrates 104. The substrates 104 and the bath 194 are separated at the controlled rate to form the thin films 392 of fluid 192 on the substrates 104 as the substrates 104 are positioned in the chamber 144. Further, the hot gas 160 directed into the chamber 160 and across the substrates 104 and out of the chamber 144 continuously transfers thermal energy to the substrates 104. Since the fluid 192 is not drained from the bath 194 to enable flow of the gas 160 from the chamber 144, for example, the directing of the hot gas 160 out of the chamber 144 is not only continuous, but independent of the separation of the bath 194 and the substrates 104. With the thin films 392 formed uniformly on the planar sides 124 and 132, and with the thin films 392 provided with thermal energy as the substrates 104 move up in the chamber 144, the thermal energy transferred to the substrates 104 rapidly evaporates the thin films 392 without decreasing the rate of pull of the substrates 104 below the maximum rate at which the meniscus 388 will form. Such efficient removing is also promoted by controlling the relative humidity in the chamber 144, as controlled by the speed of the fan 174. The above-described preferred relative humidity inhibits recondensation of the evaporated thin films 392 and condensation of vapor from the bath 194 onto the substrates 104.

As described, such efficient removal enables the substrate throughput of such apparatus 100 and method to be limited only by the type of substrates 104 that are being dried, and the type of fluid 192 used to wet the substrates 104. Thus, reliance is not placed on the thermal energy stored in a given substrate 104 to provide all of the thermal energy necessary to evaporate liquid 192 from the substrates 104. Therefore, the described problems with the prior art dryers are avoided.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for drying batches of wafers, comprising:
   an elongated bath enclosure configured to hold fluid, the fluid defining a top fluid surface, the elongated bath enclosure having an upper end defined by a weir having a saw-toothed configuration; and
   a temperature and humidity-controlled chamber defined above the upper end, the chamber being elongated corresponding to the elongation of the elongated bath and having opposing long walls, the chamber having a series of first openings along the long walls at a first location adjacent to the upper end and opposed second openings at a second location that is spaced from the upper end.

2. A system according to claim 1, further comprising:
   the opposing long walls of the chamber extending away from the upper end from the first location to the second location; and
   a heater for maintaining the opposing long walls at a selected temperature so as to transfer thermal energy into the chamber between the first location and the second location.

3. A system according to claim 1, further comprising:
   a hot gas supply connected to the second openings for causing a flow of hot gas from the second location through the chamber toward the first location, away from the top fluid surface, and out of the first openings.

4. A system according to claim 3, further comprising:
   a variable speed fan connected to the first openings for drawing the flow of hot gas from the chamber; and
   a controller responsive to the relative humidity in the chamber for controlling the speed of the fan.

5. A system according to claim 1, wherein the wafers have opposite planar sides that are parallel to a planar axis; the system further comprising:
   a wafer transport unit for immersing a plurality of batches of wafers in the fluid with the planar axis of each wafer generally perpendicular to the fluid surface and the opposite planar sides of each wafer generally perpendicular to the long walls; and
   a drive for causing the wafer transport unit to move the batches of wafers within and out of the fluid with the planar axis remaining generally perpendicular to the fluid surface, the drive controlling the rate of movement of the batches of wafers according to the location of the batches of wafers within and out of the fluid.

6. A system according to claim 5, the system further comprising:
   a heat transfer unit attached to the long walls for transferring thermal energy to portions of the wafers that are out of the fluid as the wafers are moved at a controlled rate from the fluid into the chamber.

7. A system according to claim 6, further comprising:
   a hot gas supply connected to each of the opposed second openings for flowing hot gas in a plurality of opposed curtains through the chamber and across the portion of each of the opposite planar sides of the wafers and out of the chamber through the first openings to continuously transfer thermal energy at a selected temperature to the portion of each opposite planar side of the wafer and to a thin layer of fluid that forms on each portion as the wafers move out of the fluid.

8. A system according to claim 1, further comprising:
   a wafer transport unit for simultaneously immersing a plurality of batches of wafers in and removing the batches of wafers from the fluid;
   a drive for causing the wafer transport unit to simultaneously move the batches of wafers within and out of the fluid; and
   a controller for causing the drive to simultaneously move the batches of wafers at rates of movement controlled according to the location of the batches of wafers within and out of the fluid.

9. A system according to claim 8, wherein one of the controlled rates of movement is a substantially constant rate of movement of the batches of wafers out of the fluid to form a thin film of fluid on opposite planar sides of a portion of each wafer just exiting the fluid.

10. A system according to claim 8, further comprising:

the controller causing the drive to immerse the batches of wafers in the fluid and move the batches of the wafers to a deep immersion depth below the top fluid surface.

11. A system according to claim 8, further comprising:

the controller causing the drive to hold the batches of wafers immersed in the fluid at a deep immersion depth below the top fluid surface for a predetermined period of time, and then to rapidly move the batches of wafers to a shallow immersion depth below and adjacent to the top fluid surface.

12. A system according to claim 8, further comprising:

opposed doors movably mounted adjacent to the second openings for opening and closing the chamber;

the controller causing the drive to move the batches of wafers through the elongated chamber to a location adjacent to the opposed doors; and a sensor responsive to the batches of wafers at the location adjacent to the doors for opening the doors to permit the batches of dried wafers to exit the elongated chamber.

13. A system according to claim 8, further comprising:

a pump for recirculating the fluid from and back into the bath; the controller causing the pump to stop recirculating the fluid; and the controller then being effective to cause the drive to pull the batches of wafers at a constant rate of movement out of the fluid to dry the wafers.

14. Apparatus for drying a plurality of batches of wafers, each of the wafers having opposite sides, the apparatus comprising:

a bath adapted to contain hot liquid, the liquid defining an upper liquid surface, the bath being elongated to simultaneously receive the plurality of batches of wafers aligned in series along a batch wafer path, the bath having a saw toothed weir defining an upper end of the bath over which the liquid may flow out of the bath;

a liquid collection tank surrounding and supporting the bath for receiving the liquid flowing over the weir, the tank having an upper end above the weir;

a drain system connected to the tank for recirculating the liquid that flowed over the weir, the drain system filtering, heating and returning the liquid to the bath;

an enclosure configured to receive the plurality of batches of wafers aligned in series along the batch wafer path, the enclosure having opposing elongated walls positioned on opposite sides of the batch wafer path, the enclosure having an upper end and a base spaced from the upper end, the walls being connected to the tank for supporting the tank and the bath;

a series of gas inlets defined in each of the opposing elongated walls at the upper end of the enclosure and spaced from the weir, the inlets extending along the opposing elongated walls on opposite sides of an upper position of the batch wafer path; and a gas outlet adjacent to the base of each of the elongated walls and spaced from the upper liquid surface;

the enclosure and the inlets and the outlets defining continuous gas flow paths from the inlets through the enclosure to the outlets, the flow path extending across the weir for drawing ambient vapor from the bath directly to the outlets.

15. Apparatus according to claim 14, further comprising:

a heat transfer unit for heating the walls and supplying hot gas to the inlets, the hot gas being under pressure so as to flow in the continuous flow paths, the heat transfer unit transferring thermal energy to the enclosure so that the enclosure radiates thermal energy across the continuous flow paths.

16. Apparatus according to claim 14, further comprising:

a wafer carrier movable in the bath and in the enclosure perpendicular to the batch wafer path for moving the batches of wafers; and a controller for causing the carrier to move in the bath and in the enclosure at controlled rates according to the location of the carrier relative to the continuous flow paths.

17. A system according to claim 16, wherein one of the controlled rates of movement is a substantially constant rate of movement of the batches of wafers out of the liquid to form a thin film of liquid on a portion of the opposite planar sides of each wafer as each wafer exits the liquid.

18. A system according to claim 16, further comprising:

the controller causing the carrier to immerse the batches of wafers in the liquid in the bath and move the batches to a deep immersion depth below the upper surface of the liquid.

19. A system according to claim 16, further comprising:

the controller causing the carrier to hold the batches of wafers immersed in the liquid at a deep immersion depth below the upper liquid surface for a predetermined period of time, and then causing the carrier to rapidly move the batches of wafers to a shallow immersion depth below and adjacent to the upper liquid surface.

20. A system according to claim 16, further comprising:

opposed doors movably mounted at the upper end of the enclosure for opening and closing the enclosure; and the controller causing the carrier to move the batches of wafers in the enclosure to a location adjacent to the doors; and upon movement of the batches of wafers to the location adjacent to the doors the controller causing the doors to open to permit the batches of wafers to exit the enclosure.

21. A system according to claim 16, further comprising:

a pair of opposed doors mounted at the upper end of the enclosure and being movable together to close the upper end of the enclosure and apart to allow the carrier and the batches of wafers to exit the enclosure;

the controller causing the carrier with the batches of wafers to move from a first location out of the liquid toward the upper end of the enclosure, and to pause at a second location adjacent to the upper end to position the carrier in the incoming hot gas; and in response to the carrier at the second location, the controller causing the doors to open during the pause.

22. A system according to claim 16, further comprising:

the controller synchronizing the movement of the carrier in the bath and in the enclosure with the supply of the hot gas to the inlets, the synchronizing reducing the flow of the hot gas as the carrier moves in the enclosure toward and through the upper liquid surface.

23. Apparatus according to claim 14, wherein the wafers each have opposite planar sides and a narrow edge between the sides, the carrier further comprising:

elongated spaced arms configured to extend in the enclosure parallel to and between the opposing elongated walls; and a wafer batch nest corresponding to each batch of the wafers, each nest including a plurality of spaced bars and spaced end plates mounting the bars on the spaced arms, each of the bars including a vertical surface intersecting a V-shaped notch corresponding to each wafer to be carried, each V-shaped notch being formed in the bar with a valley and opposite walls extending at an acute angle with respect to the vertical surface, the vertical surface and the acute angle of the V-shaped notch combining to limit the contact between the wafer and each V-shaped notch, the contact being a substantially point contact between one of the opposite walls of the notch and one end of the narrow edge of the wafer.

24. Apparatus according to claim 14, further comprising:

a relatively short wall at each end of the opposing elongated walls;

the upper end of the enclosure comprising an elongated opening defined by the opposing elongated walls and by the relatively short walls, the elongated opening being configured to receive the plurality of batches of wafers aligned in the series along the batch wafer path;

a plurality of doors, each door having first ends adjacent to one of the short walls and opposite second ends adjacent to the other of the short ends;

door mounts adjacent to each of the short walls for guiding the doors across the elongated opening in opposition to each other;

a drive mounted adjacent to one of the short walls and connected to the first end of one of the doors;

a first endless belt driven by the drive and connected to the corresponding first end of the other of the doors so that the corresponding first ends of the doors move simultaneously on the door mounts;

a connecting shaft for each of the doors, the shafts being driven by the first endless belt and extending from the one of the short walls to the other of the short walls; and a second endless belt driven by the connecting shafts for moving the opposite corresponding second ends of the doors simultaneously and in synchronism with the movement of the corresponding first ends of the doors to open or close the elongated opening.

25. A system according to claim 14, further comprising:

a standpipe positioned in the liquid collection tank, the standpipe having an inlet located below the level of weir for draining excess liquid from the tank.

* * * * *

UNITED STATES PATENT AND TRADEMARK OFFICE
CERTIFICATE OF CORRECTION

PATENT NO. : 6,430,841 B1  
APPLICATION NO. : 09/580825  
DATED : August 13, 2002  
INVENTOR(S) : Borkowski et al.

Page 1 of 1

It is certified that error appears in the above-identified patent and that said Letters Patent is hereby corrected as shown below:

Title Page, Item (73) Assignee should read

Lam Research Corporation, Fremont, CA (US) and  
Oliver Design, Inc., Scotts Valley, CA (US)

Signed and Sealed this

Twenty-eighth Day of November, 2006

JON W. DUDAS  
*Director of the United States Patent and Trademark Office*